US006982786B2

(12) United States Patent
Shiode

(10) Patent No.: US 6,982,786 B2
(45) Date of Patent: Jan. 3, 2006

(54) RETICLE AND OPTICAL CHARACTERISTIC MEASURING METHOD

(75) Inventor: Yoshihiro Shiode, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 15 days.

(21) Appl. No.: 10/307,945

(22) Filed: Dec. 3, 2002

(65) Prior Publication Data

US 2003/0197865 A1 Oct. 23, 2003

Related U.S. Application Data

(63) Continuation of application No. PCT/JP02/07342, filed on Jul. 19, 2002.

(30) Foreign Application Priority Data

Apr. 17, 2002 (JP) ........................................ 2002/114425

(51) Int. Cl.
*G01J 1/00* (2006.01)
*G01B 11/00* (2006.01)

(52) U.S. Cl. ...................... 356/121; 356/124; 356/401
(58) Field of Classification Search ................. 356/121, 356/124, 401, 400, 399; 438/401
See application file for complete search history.

(56) References Cited

U.S. PATENT DOCUMENTS

| | | | | | |
|---|---|---|---|---|---|
| 4,943,733 | A | * | 7/1990 | Mori et al. | 250/548 |
| 5,173,380 | A | * | 12/1992 | Kamon | 430/5 |
| 5,300,967 | A | * | 4/1994 | Kamon | 353/97 |

(Continued)

FOREIGN PATENT DOCUMENTS

| | | |
|---|---|---|
| JP | 6-120116 | 9/1994 |
| JP | 2000-97666 | 4/2000 |
| JP | 2001-338866 | 12/2001 |
| JP | 2002-33269 | 1/2002 |
| JP | 2002-250677 | 9/2002 |

OTHER PUBLICATIONS

International Search Report dated Oct. 22, 2002, and issued on Nov. 5, 2002, in corresponding International patent appln. No. PCT/JP02/07342.

International Preliminary Examination Report dated Oct. 30, 2003, transmitted in a Notification of Translation of Copies of the international Preliminary Examination Report, mailed Nov. 18, 2004, in corresponding PCT application number PcT/JP2002/007342.

*Primary Examiner*—Frank G. Font
*Assistant Examiner*—Layla Lauchman
(74) *Attorney, Agent, or Firm*—Fitzpatrick, Cella, Harper & Scinto

(57) ABSTRACT

In an optical characteristic measuring method for measuring an optical characteristic of a projection optical system (10*a*), a reticle (9) having a plurality of patterns (TP) is supplied, and scattered light from an aperture is directed to the plurality of patterns (TP), whereby light beams are projected onto the plurality of patterns in mutually different directions, by which images of the plurality of patterns are formed through the projection optical system (10*a*). Positions of images of the plurality of patterns, respectively, are detected and, by use of the result of detection, the optical characteristic of the projection optical system is detected. This accomplishes an optical characteristic measuring method and a reticle to be used therefor, which are suitable for measuring an optical characteristic of an optical system such as wavefront aberration, for example, at high precision.

30 Claims, 14 Drawing Sheets

U.S. PATENT DOCUMENTS

| | | | | |
|---|---|---|---|---|
| 5,420,417 A | * | 5/1995 | Shiraishi | 250/205 |
| 5,644,390 A | * | 7/1997 | Yasuzato | 356/121 |
| 5,828,455 A | | 10/1998 | Smith et al. | 356/354 |
| 5,973,771 A | * | 10/1999 | Hibbs et al. | 356/121 |
| 5,978,085 A | | 11/1999 | Smith et al. | 356/354 |
| 6,057,914 A | * | 5/2000 | Yedur et al. | 356/124 |
| 6,249,335 B1 | * | 6/2001 | Hirukawa et al. | 355/53 |
| 6,310,679 B1 | * | 10/2001 | Shiraishi | 355/3 |
| 6,312,373 B1 | | 11/2001 | Ichihara | 515/359 |
| 6,317,198 B1 | * | 11/2001 | Sato et al. | 355/77 |
| 6,356,345 B1 | * | 3/2002 | McArthur et al. | 356/121 |
| 6,456,382 B2 | | 9/2002 | Ichihara et al. | 356/513 |
| 6,548,312 B1 | * | 4/2003 | Hayano et al. | 438/5 |
| 6,556,286 B1 | * | 4/2003 | La Fontaine et al. | 356/124 |
| 6,573,015 B2 | | 6/2003 | Fujimoto | 430/30 |
| 6,580,492 B2 | | 6/2003 | Fujimoto | 355/52 |
| 2001/0028462 A1 | | 10/2001 | Ichihara et al. | 356/512 |
| 2002/0008860 A1 | | 1/2002 | Fujimoto | 355/52 |
| 2002/0015158 A1 | | 2/2002 | Shiode et al. | 356/614 |
| 2002/0159048 A1 | | 10/2002 | Inoue et al. | 356/121 |
| 2002/0191195 A1 | | 12/2002 | Ichihara et al. | 356/521 |

* cited by examiner

RETICLE AND OPTICAL CHARACTERISTIC MEASURING METHOD

This application is a continuation application of pending International Application No. PCT/JP02/07342, filed on Jul. 19, 2002.

TECHNICAL FIELD

This invention relates to a method of measuring an optical characteristic of a projection optical system and a reticle to be used in that method. For example, the invention is suitable for measurement of an optical characteristic, such as wavefront aberration, for example, of a projection optical system of a projection exposure apparatus, which is used in a lithographic process for the manufacture of semiconductor devices, liquid crystal display devices, thin film magnetic heads, or the like.

BACKGROUND ART

The manufacture of semiconductor devices, liquid crystal display devices, thin film magnetic heads, or the like, based on a lithographic process uses a projection exposure apparatus for projecting an image of a pattern of a photomask or reticle (hereinafter, simply "reticle") onto a photosensitive substrate through a projection optical system (e.g., a projection lens). In such a projection exposure apparatus, a decrease of pattern resolving power resulting from aberration of the projection optical system remaining due to the design thereof or the manufacture thereof becomes a large problem.

In consideration of this, technology for very precisely measuring the optical characteristic of a projection optical system, such as aberration, has been desired.

Aberrations of a projection lens such as spherical aberration, image plane (curvature of field), astigmatism (astigmatic aberration), coma (coma aberration), wavefront aberration, etc., are measured, and it is used for practical evaluation and inspection. Among these aberrations, the wavefront aberration is the significant aberration. By approximating this wavefront aberration on the basis of a generally used Zernike polynomial or the like, aberrations such as coma, astigmatism, image plane, and spherical aberration, which are factors of the polynomial, can also be calculated. Also, from the standpoint of prediction of process margin for a wide variety of device patterns based on simulations, the measurement of wavefront aberration is regarded as being important.

Wavefront aberration measuring methods are proposed in U.S. Pat. Nos. 5,828,455 and 5,978,085, for example. In the measuring methods proposed there, a grid-like pattern is provided on a reticle pattern surface and a pinhole is provided right below the center of the grid-like pattern with a small spacing kept from it. Further, on the reticle upper surface, there is a special reticle having a convex lens placed just above the center of the grid-like pattern. When this reticle is illuminated by an illumination system of an exposure apparatus, due to the aforementioned convex lens, the illumination angle (NA) of the illumination light emitted from the illumination system is made into an angle not less than σ1, and this light illuminates the grid pattern below it. Light passed through the grid pattern goes through the pinhole below it. At this time, the light that can pass through the pinhole is limited only to such light having an angle connecting the position of each point on the grid pattern and the aforementioned pinhole. Therefore, light beams emitted from respective points on the grid pattern advance in the form of plural light beams having mutually different angles. These light beams having mutually different angles arrive at mutually different positions upon a pupil plane of the projection lens and, while being influenced by the wavefront aberration of the projection lens, they reach a wafer surface to image each point of the grid pattern thereon. Here, the images of each point of the imaged grid pattern have been influenced by the wavefront aberration (phase) differently. Namely, since a light ray advances in a direction of a normal to the wavefront, the imaging position of an image of each point on the grid pattern shifts from an idealistic position by an amount corresponding to the tilt at a corresponding point on the wavefront. In consideration of this, by measuring the deviations, from an idealistic grid, of images of each point of the grid pattern, tilts of the wavefront at each point on the pupil plane are obtained and, by using various mathematical techniques, the wavefront is calculated.

The wavefront measuring methods proposed in the aforementioned U.S. Pat. Nos. 5,828,455 and 5,978,085 are a method close to the well-known Hartman's method. In Hartman's method, a pinhole is disposed on a pupil plane of a projection lens to restrict the position of the wavefront and, from a positional deviation of a pattern image, which is formed by light passed therethrough and imaged, the tilt of the wavefront is detected.

In Hartman's method, by placing a pinhole on the pupil plane, the object spectrum bears, according to equation (1) below and by the pinhole filter, only information of a certain small wavefront region.

$$E(x) = F-1[G(f) \cdot p(f) \cdot w(f)] \quad (1)$$

F-1: Fourier inverse transform
E(x): optical amplitude function of image
G(f): object spectrum
w(f): pupil (wavefront) function
p(f): pinhole function Although it is desirable to control the shape of the object spectrum (pupil filtering), accurately, by placing a pinhole on a pupil plane as in Hartman's method, in practical exposure apparatuses, it is difficult because of the space of a barrel, a purge structure for contamination prevention, or the like, and also with respect to the cost.

In the methods proposed in the aforementioned U.S. Pat. Nos. 5,828,455 and 5,978,085, the pinhole filter is placed just below the reticle. Therefore, the object spectrum on the pupil plane is, unlike the equation (1) above, a Fourier transform-including a phase term.

An object of the present invention is to provide an optical characteristic measuring method suitable for high-precision measurement of an optical characteristic of an optical system such as wavefront aberration, for example, and a reticle to be used in such a measuring method.

Another object of the present invention is to provide an optical characteristic measuring method which enables measurement of an optical characteristic such as wavefront aberration, for example, in a completely different way from the methods disclosed by the aforementioned two U.S. patents, and a reticle to used in such a measuring method.

A further object of the present invention is to provide a projection exposure apparatus into which an optical characteristic measuring method or a reticle, described above, can be incorporated.

DISCLOSURE OF THE INVENTION

A first aspect of the present invention concerns an optical characteristic measuring method for measuring an optical characteristic of a projection optical system, characterized in that:

a reticle having a plurality of patterns is supplied;

scattered light from an aperture is directed to said plurality of patterns, whereby light beams are projected on said plurality of patterns in mutually different directions, by which images of said plurality of patterns are formed through said projection optical system; and positions of the images of said plurality of patterns are detected and, by use of the result of the detection, the optical characteristic of said projection optical system is detected.

A second aspect of the present invention concerns the first aspect, and it is characterized in that a light blocking member having said aperture is present on said reticle.

A third aspect of the present invention concerns the first aspect, and it is characterized in that a light blocking member having said aperture is present above said reticle.

A fourth aspect of the present invention concerns the second or third aspect, and it is characterized in that there is a scattering portion for producing the scattered light.

A fifth aspect of the present invention concerns the fourth aspect, and it is characterized in that said scattering portion is present inside said aperture.

A sixth aspect of the present invention concerns the fourth aspect, and it is characterized in that said scattering portion is present between a light source and said aperture.

A seventh aspect of the present invention concerns the first to sixth aspects, and it is characterized in that said scattering portion is illuminated by use of an effective light source in which, as in a ring, for example, a central portion is darker than a peripheral portion.

An eighth aspect of the present invention concerns the first to seventh aspects, and it is characterized in that the aperture is a pinhole.

A ninth aspect of the present invention concerns the first to eighth aspects, and it is characterized in that the pattern has an opening portion for producing a predetermined periodic component on a pupil plane of said projection optical system as well as periodic opening portions defined at opposite sides of that opening portion and for producing a periodic component, different from the periodic component, on the pupil plane of said projection optical system.

A tenth aspect of the present invention concerns the first to eighth aspects, and it is characterized in that the pattern has lines of spaces in which, with respect to a direction of repetition and from a center to a periphery, the spaces have a substantially regular pitch while widths of the spaces gradually decrease, and in which adjacent lines are not resolvable by said projection optical system.

An eleventh aspect of the present invention concerns the first to eighth aspects, and it is characterized in that the pattern has lines and spaces for directing substantially only zeroth order light to an image plane of the projection optical system.

A twelfth aspect of the present invention concerns the first to eleventh aspects, and it is characterized in that the detecting step includes a step of photoelectrically converting an aerial image of the lines and spaces.

A thirteenth aspect of the present invention concerns the first to eleventh aspects, and it is characterized in that the detecting step includes a step of exposing a photosensitive substrate with an image of the lines and spaces, and a step of developing the photosensitive substrate.

A fourteenth aspect of the present invention concerns the first to fourteenth aspects, and it is characterized in that the optical characteristic includes wavefront aberration.

A fifteenth aspect of the present invention concerns a projection exposure apparatus characterized by having a mode for measuring an optical characteristic of a projection optical system in accordance with a measuring method of any one of the first to fourteenth aspects, and by having an illumination system for projecting illumination light to the test pattern when the reticle is supplied to the apparatus.

A sixteenth aspect of the present invention concerns a device manufacturing method characterized by supplying a reticle for device manufacture to a projection exposure apparatus according to the fifteenth aspect, and by exposing a substrate with a pattern of the reticle.

A seventeenth aspect of the present invention concerns a reticle, characterized by: a plurality of patterns formed on a front face of a substrate; and a light blocking portion with an aperture, being formed on a rear face of the substrate, and a light scattering portion for producing scattered light from the aperture.

An eighteenth aspect of the present invention concerns the seventeenth aspect, and it is characterized in that the aperture is a pinhole.

A nineteenth aspect of the present invention concerns the seventeenth aspect, and it is characterized in that the light scattering portion is present inside the aperture.

A twentieth aspect of the present invention concerns a measurement unit for measuring an optical characteristic of a projection optical system, characterized by a reticle having a plurality of patterns formed on a front face of a substrate, and a light blocking portion with an aperture, being formed on a rear face of the substrate, as well as a light scattering portion for producing scattered light from the aperture.

A twenty-first aspect of the present invention concerns the seventeenth aspect, and it is characterized in that the aperture is a pinhole.

A twenty-second aspect of the present invention concerns the twentieth aspect, and it is characterized in that the light blocking portion is formed on a rear face of the substrate, and the light scattering portion is formed on another substrate.

A twenty-third aspect of the present invention concerns the twenty-first aspect, and it is characterized in that the light scattering portion is formed on a reticle side surface of the other substrate.

A twenty-fourth aspect of the present invention concerns the twentieth aspect, and it is characterized in that the light blocking portion and the light scattering portion are formed on another substrate.

A twenty-fifth aspect of the present invention concerns the twenty-third aspect, and it is characterized in that the light blocking portion is formed on a reticle side surface of the other substrate, and the light scattering portion is formed on a surface of the other substrate, opposite to the reticle side.

A twenty-sixth aspect of the present invention concerns the twenty-third aspect, and it is characterized in that the light blocking portion and the light scattering portion are formed on a surface of the-other substrate, opposite to the reticle side.

BEST FORM FOR EMBODYING THE INVENTION

Figure 1:
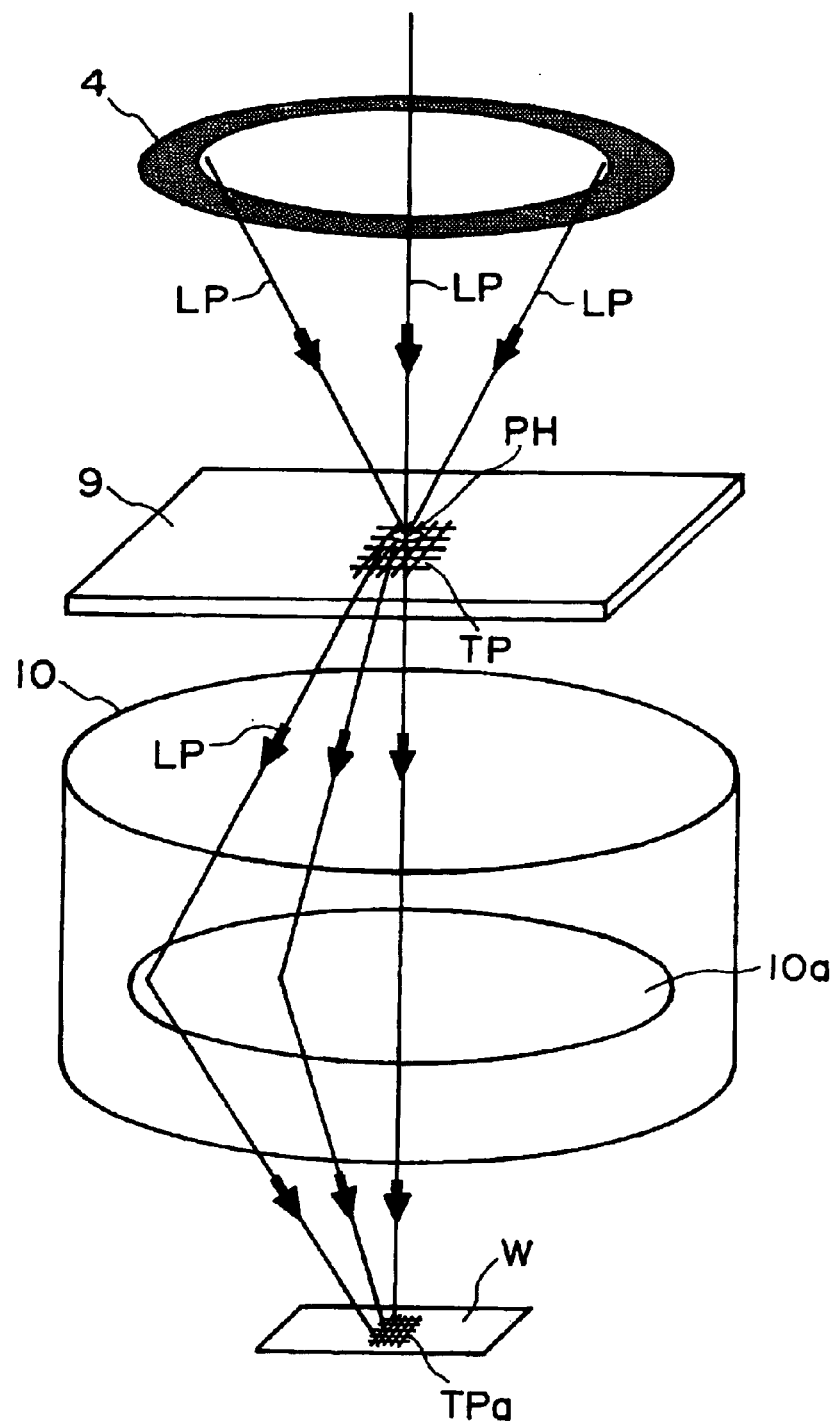
FIG. 1 is a schematic view of a main portion of a projection exposure apparatus according to a first embodiment of the present invention.

FIG. 1 is a schematic view of a main portion of an exposure apparatus according to a first embodiment of the present invention.

The first embodiment shows a projection exposure apparatus for projecting a circuit pattern onto a photosensitive substrate through a projection optical system. The exposure apparatus of the first embodiment has a measurement mode for measuring wavefront aberration of an optical system (projection lens) in accordance with an optical characteristic measuring method of the present invention. As a matter of course, a similar measurement may be made to this optical system during the manufacture of the exposure apparatus.

In FIG. 1, denoted at 9 is a test reticle. The test reticle 9 has a pattern group (test pattern) TP formed on the lower surface (front face) of a substrate glass, as well as a light blocking portion with an aperture (pinhole) PH formed on the upper surface (rear face) of this glass. Measurement of wavefront aberration of the projection lens is performed as follows.

Illumination light from an effective light source 4 of an illumination optical system, having a spread of an angle equivalent to σ>1 or σ=1, is projected to the pinhole PH at the upper surface of the test reticle 9. With light beams passed through the pinhole PH (aperture) on the upper surface of the reticle 9, patterns of the test pattern TP formed on the lower surface of the reticle 9 are illuminated from mutually different directions. In response, the patterns of the test pattern TP are imaged by the projection lens 10. The positions (deviations from a reference position) of aerial images of them or of transferred pattern images TPa of them being transferred to a photosensitive substrate W, are measured by means of a measuring tool of a known type. Then, on the basis of positional information of these images, tilts of the wavefront at positions corresponding to each image, along the pupil plane 10a, are calculated. From the results, the wavefront aberration of the projection lens 10 is measured. Once the wavefront aberration is obtained, spherical aberration, coma aberration, curvature of field, astigmatic aberration and distortion aberration can be detected.

The test pattern TP and the light blocking portion having the pinhole PH may not be formed on one and the same plate as shown in FIG. 1. They may be formed on different plates. In summary, it is necessary but sufficient that there is one or more aerial images or transferred pattern images TPa whose positions should be measured, and that it is illuminated with illumination light having a principal ray LP advancing along a direction (predetermined tilt angle and also predetermined azimuth angle), which is determined in dependence upon the positional relationship of the illumination light, in a direction along the plane of incidence upon the reticle 9, between the center of the pinhole PH above the pattern that corresponds to the position of each aerial image or transferred pattern image TPa and the center of that pattern.

Figure 5A:
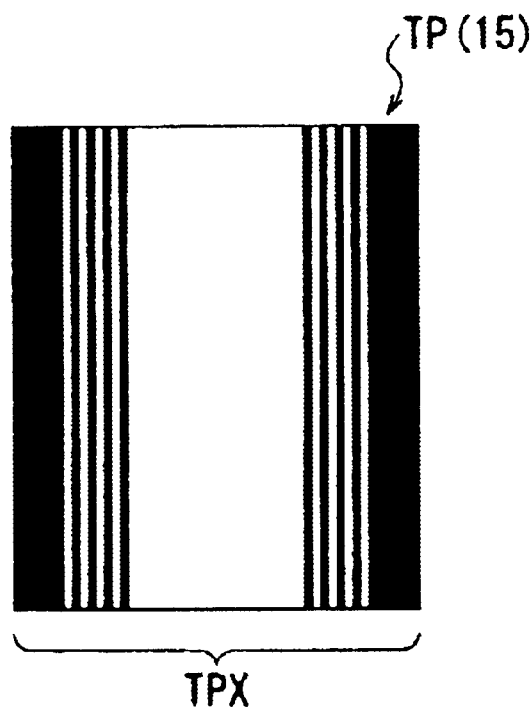
FIGS. 5A and 5B are views for explaining a pattern structure of a test pattern according to the present invention.
Figure 5B:
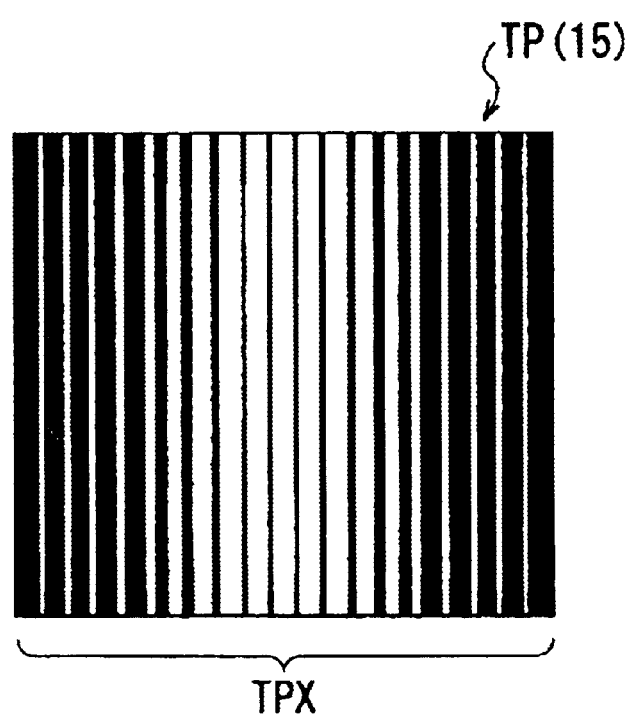

Each pattern TPX constituting the test pattern TP has, as shown in FIG. 5A, an opening portion for producing a predetermined periodic component on a pupil plane 10a of the projection optical system 10, as well as periodic opening portions formed at the opposite sides of the aforementioned opening portion and for producing a periodic component different from the aforesaid periodic component, upon the pupil plane 10a of the projection optical system 10, such that substantially only zeroth order light passing through the pupil plane 10a of the projection optical system 10 contributes to the imaging. Alternatively, as shown in FIG. 5B, it comprises lines and spaces in which, with respect to a repetition direction thereof and from the center to the periphery, the lines or spaces have a substantially regular pitch while the widths of the spaces decrease gradually, such that substantially only zeroth order light passing through the pupil plane 10a of the projection optical system 10 contributes to the imaging, and that adjacent lines are not resolvable by the projection optical system 10.

Next, referring to FIG. 2, a projection exposure apparatus, having a measurement mode for measuring wavefront aberration of a projection optical system in accordance with the optical characteristic measuring method described above, will be explained as a second embodiment of the present invention In the second embodiment, as regards the projection optical system 10, not only a projection optical system (projection lens) using lenses but also a projection optical system using mirrors, or a projection optical system having a combination of lenses and mirrors, or the like, are applicable.

Figure 2:
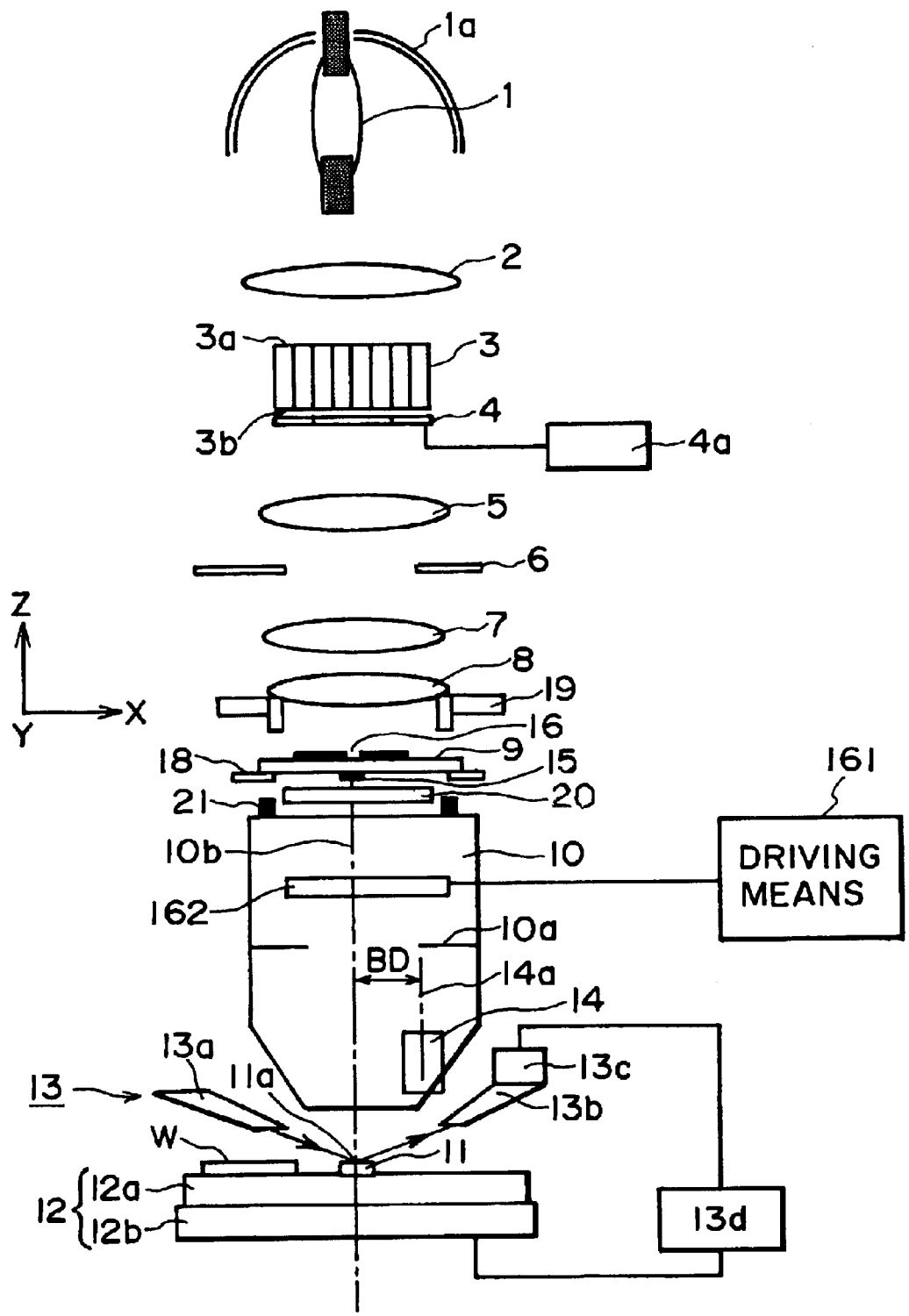
FIG. 2 is a schematic view of a projection exposure apparatus according to a second embodiment of the present invention.

In FIG. 2, denoted at 1 is a high pressure Hg lamp which emits exposure light. The exposure light emitted from the light source 1 is collected by an elliptical mirror 1a and, after this, it goes through an input lens 2 and is incident on a light entrance surface 3a of a fly's eye lens 3. At a rear (test reticle 9 side) focal plane 3b of the fly's eye lens 3, there are a large number of secondary light sources formed. Exposure light emitted from these secondary light sources goes by way of a variable aperture stop 4, a first-relay lens 5, a projection type reticle blind 6, a second relay lens 7, and a main condenser lens 8, and it illuminates the test reticle 9 with uniform illuminance. The rear focal plane 3b of the fly's eye lens 3 is approximately conjugate with the pupil plane 10b of the projection optical system 10. Also, the aperture diameter of the aperture stop 4 is variable.

Figure 17:
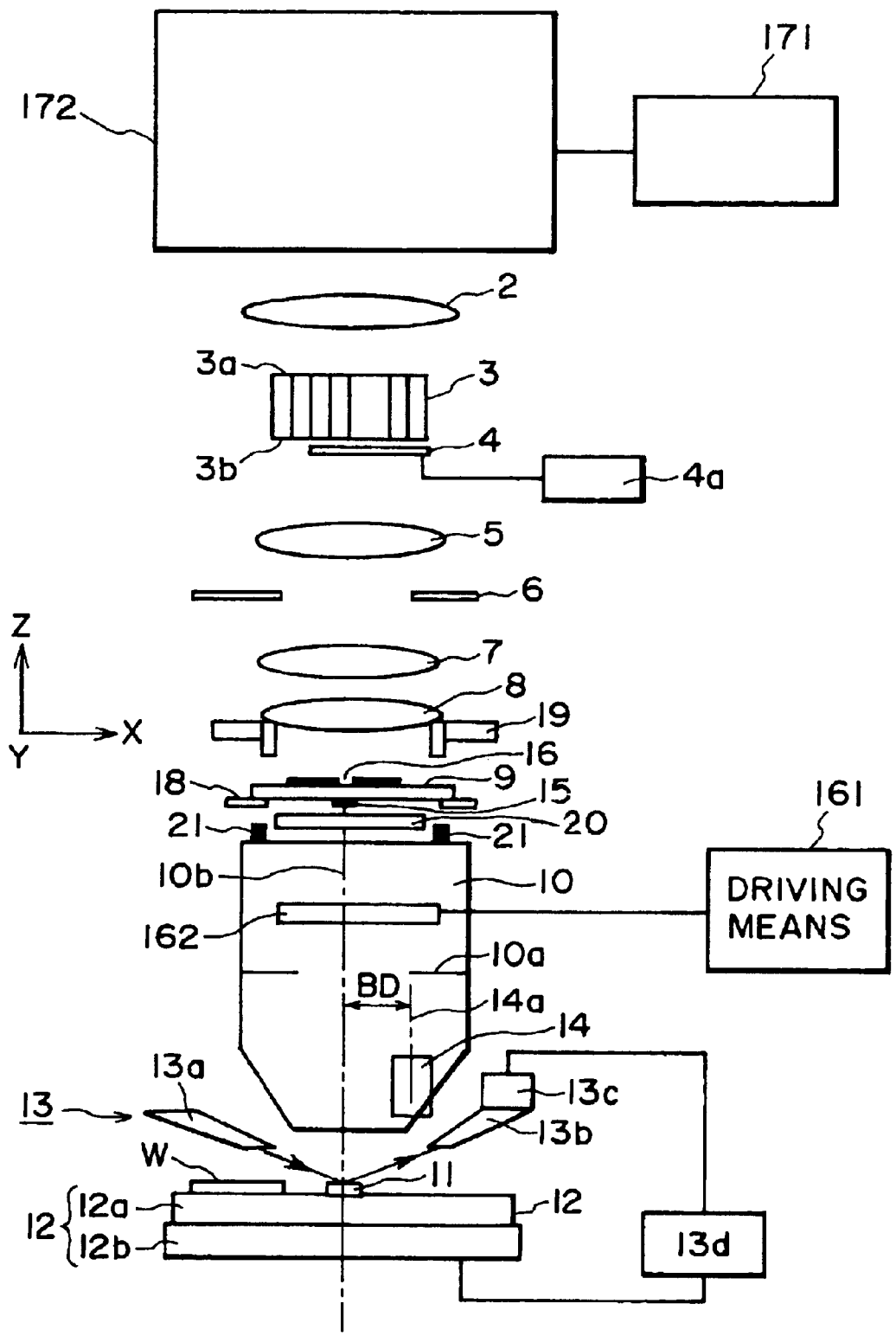
FIG. 17 is a schematic view of another example of an exposure apparatus according to the present invention.

A measured value (aberration) obtained in accordance with a measuring method (to be described later) may be fed back to a control system of the exposure apparatus main assembly, such that various aberrations of the projection optical system 10 can be corrected by various methods and means known in the art. For example, through the control system described above and as shown in FIG. 2, a correcting optical system 162 inside the projection optical system 10 may be driven by a driving means 161 or, alternatively, through the control system and as shown in FIG. 17, the emission wavelength of a laser 172 (i.e., the center wavelength of laser light) may be changed by wavelength changing means 171. This enables automatic correction or automatic setting of the aberration of the projection optical system 10. Here, the projection exposure apparatus of FIG. 17 differs from the apparatus of FIG. 2 in the point of the illumination system having a laser 172 as a light source and the use of wavelength changing means 171.

Now, the test reticle 9 is placed on a reticle stage 18, and the position of the test reticle 9 can be changed by moving the reticle stage 18 along the X-Y plane. A scope 19 is provided to observe a mark on the test reticle 9 and a reticle reference mark 2 provided inside the apparatus major assembly, simultaneously, thereby to measure deviation of the test reticle 9 with respect to the reticle reference mark 21 in the X and Y directions. By moving the stage 18 on the basis of the measurement result, the reticle 9 can be brought into alignment with the apparatus major assembly (projection optical system 10). Further, the scope 19 is provided with a driving system capable of moving it to any X and Y position upon the test reticle 9. Therefore, if necessary, by using the scope 19, it is possible to illuminate the region of a test pattern 15 at an arbitrary position on the reticle 9, with exposure light. The test pattern 15 is constituted by plural patterns, and each pattern has a form such as shown in FIG. 5A or 5B.

The projection type reticle blind 6 and the pattern bearing surface of the test reticle 9 are conjugate with each other, and an illumination region on the test reticle 9 is defined by means of the aperture of the projection type reticle blind 6.

On the upper surface of the test reticle 9, there is a light blocking portion having a pinhole 16. By means of the aperture of the projection type reticle blind 6, a region including the pinhole 16 is set as an illumination region on the test reticle 9, and, by illuminating this region, light beams passed through the pinhole 16 of the light blocking portion illuminate plural patterns of the test pattern 15 formed on the lower surface of the test reticle 9, from mutually different directions. These patterns of the test pattern 15 are projected upon a photosensitive substrate (wafer) W by the projection optical system 10.

The positions of aerial images of these patterns, being imaged on an imaging plane of the projection optical system 10 or of pattern images (developed or latent images) transferred to the photosensitive substrate W, are measured by use of known measuring means.

Figure 3:
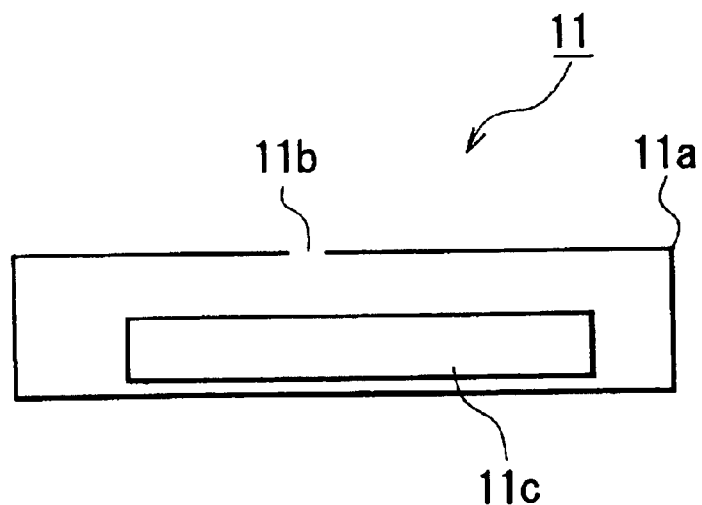
FIG. 3 is a view for explaining a detection system 11 in FIG. 2.

In this embodiment, by use of a detection system 11 provided on the wafer stage 12, the positions of the aerial images of the patterns of the test pattern 15 are detected. Through the projection optical system 10, the image of the test pattern 15 is imaged on a plate 11a, which constitutes the detection system 11 mounted on the wafer stage 12. FIG. 3 is an enlarged view of the detection system 11 of FIG. 2.

In FIG. 3, a plate 11a, a slit 11b, and a light receptor 11c constitute the detection system 11. The plate 11a is formed with the slit 11b, and the light passed through the slit 11b is received by the light receptor 11c, whereby it is photoelectrically converted into an electrical signal. The signal is transmitted to a processing unit, not shown, through a signal line, not shown. By this unit, the position of a pattern image as projected on the plate 11a is detected.

The wafer stage 12 comprises an X-Y stage 12a capable of positioning the detection system 11 at arbitrary positions along a plane perpendicular to the optical axis 10b of the projection optical system 10, a Z stage 12b capable of moving the detection system upwardly and downwardly in a direction parallel to the optical axis 10b of the projection optical system 10 to thereby set the focus position of the detection system 11, and so on.

In this embodiment, there is an autofocus system 13 for detecting the position of the detection system 11 in the optical axis 10b direction. The autofocus system 13 comprises a light sending system 13a for projecting a detecting slit-like light pattern (image), for example; onto the plate 11a of the detection system 11 from a direction being oblique with respect to the optical axis 10b of the projection optical system 10, and a light receiving system 13b for re-imaging the image of this slit-like pattern upon a photoelectric detector 13c by use of reflection light from the plate 11a.

As the position of the plate 11a in the optical axis 10b direction of the projection optical system 10 changes, in the light receiving system 13b, there occurs a change in position, on the photoelectric detector 13c, of the re-imaged light pattern image. Thus, by detecting the position of this pattern image, the position of the plate 11a in the optical axis direction can be detected. The photoelectric detector 13c produces a signal (focus signal), which is variable, with the position of the re-imaged pattern image. Thus, by the moving Z stage 12b of the wafer stage 12 through a control system 13d so that this signal is kept at a predetermined level, the position of the surf ace of the plate 11b in the optical axis 10b direction can be held at a predetermined position (image plane position of the projection optical system 10).

Also, since the focus signal changes approximately rectilinearly with a change in height of the plate 11a within a predetermined range (predetermined range in the optical axis 10b direction), a change in focus position can be detected from a change in level of the focus signal. The Z stage 12b of the wafer stage 12 has a level sensor (not shown) incorporated therein, for detecting the position of the Z stage itself in the optical axis 10b direction of the projection optical system 10.

Denoted at 14 is an off-axis type wafer alignment system. The wafer alignment system 14 detects alignment marks formed adjacent to each shot area on the wafer W, respectively. In this case, by detecting the spacing between the optical axis 10b and an optical axis 14a of the wafer alignment system 14, that is, what is called a baseline quantity BD, in advance, alignment of each shot area of the wafer 11 can be accomplished accurately on the basis of the alignment mark position as measured by the wafer alignment system 14. Further, the wafer alignment system 14 can be used to detect various marks.

For the illumination system of the exposure apparatus of this embodiment, it is necessary but sufficient that, as a result of illumination, there is produced one or more aerial images or transferred pattern images whose positions on the image plane of the optical system 10 should be measured, and that the test reticle is illuminated with illumination light having a principal ray LP advancing along a direction (predetermined tilt angle and also predetermined azimuth angle), which is determined in dependence upon the positional relationship of the illumination light, in a direction along the plane of incidence upon the reticle 9, between the center of the pinhole PH above the pattern that corresponds to the position of each aerial image or transferred pattern image TPa and the center of that pattern.

Also, in this embodiment, both of the test pattern 15 and the light blocking portion having the pinhole 16 may not be formed on a reticle. The light blocking portion may be formed on a separate plate for the pinhole.

While not shown in FIGS. 1 and 2, in the first and second embodiments, the pinhole 16 has a scattering element provided therein, such that light from an effective light source is scattered by this element, whereby light beams of σ>1 are emitted from the pinhole 16. When such a scattering element is used, the aperture shape of the variable stop 4 may have a ring-like (annular) shape, and on that occasion, an effective light source in which brightness is higher at the periphery than at the center thereof can be produced. By illuminating the scattering element by use of such an effective light source, the test pattern 15 can be illuminated uniformly, and plural patterns constituting the test pattern 15 can be illuminated with light beams having substantially the same intensity, from mutually different directions.

Figure 7:
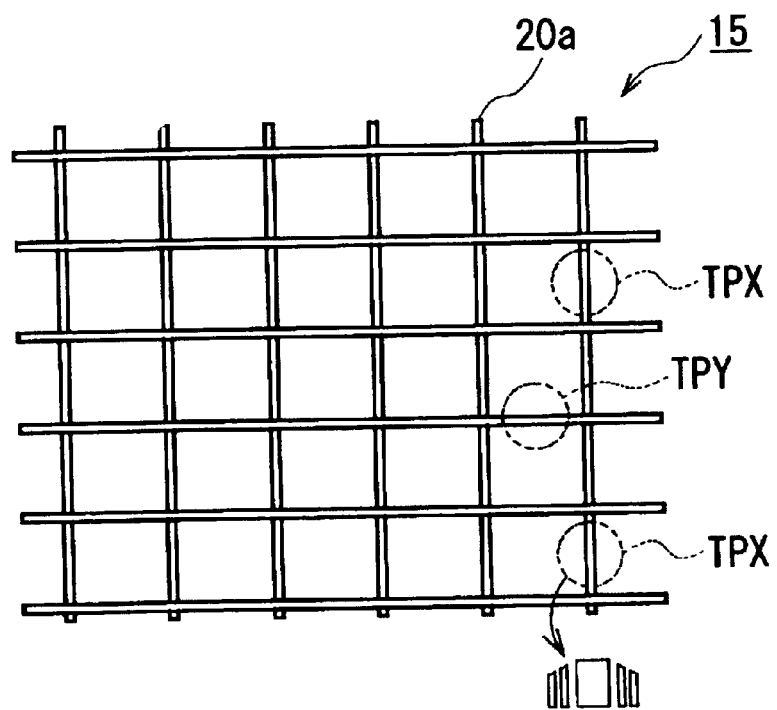
FIG. 7 is a view for explaining a mark 20a in FIG. 6.

FIG. 7 shows details of the test pattern 15 to be formed on the test reticle 9.

In FIG. 7, denoted at 20a is a mark which constitutes the test pattern 15. Some portions of the grid-like mark 20a are provided by the above-described patterns TPX shown in FIG. 5A or 5B.

The longitudinal and lateral lines constituting the mark 20a are designed with the same linewidth. When these lines are the same as the pattern shown in FIG. 5, the linewidth is 2 microns, for example.

Just above the center of such a test pattern 15 (mark 20a) described above, there is the pinhole 16, which is formed, as shown in FIGS. 1 and 2, on the upper glass surface of the reticle 9. A circular effective light source or a ring-like effective light source having a large σ (coherence factor) is used, and light is projected to the test pattern 15 through the pinhole 16 by use of an illumination system for exposure or an illumination system of the scope such that, with respect to each pattern TPX constituting the test pattern 15, the tilts of the principal rays of the light beams illuminating them are changed and, additionally, opening angles of the light beams are restricted. Here, "σ" corresponds to a value obtainable by dividing the reticle side numerical aperture of the illumination system by the reticle side numerical aperture of the projection optical system.

Figure 9:
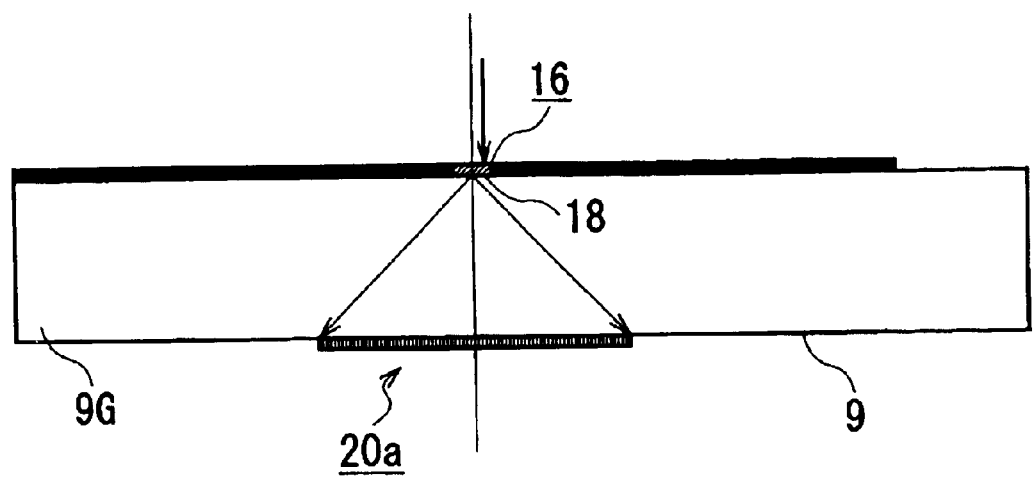
FIG. 9 is a sectional view of an example of a test reticle according to the present invention.

In this embodiment, in order to obtain an illumination condition σ≧1.0, as shown in FIG. 9, a scattering element is provided inside the pinhole 16 formed on the rear face (upper surface) of the glass substrate 9G of the reticle 9, to cause the light for illuminating the reticle 9 to be scattered and diffused.

Figure 10:
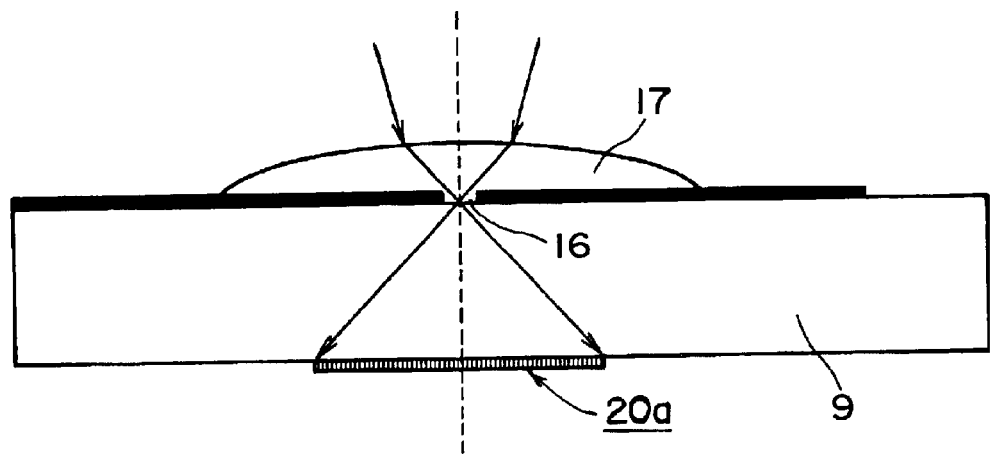
FIG. 10 is a sectional view for explaining another example of a test reticle according to the present invention.

In place of using a scattering element, a convex lens 17 may be disposed on the pinhole 16 as shown in FIG. 10, or a grating pattern having a diffusing effect may be provided inside the pinhole 16, by which an illumination condition of σ≧1.0 is attainable. Also, in the case of having such a structure, use of a circular effective light source or a ring-like effective light source having a large a σ (coherence factor) is effective.

Figure 4:
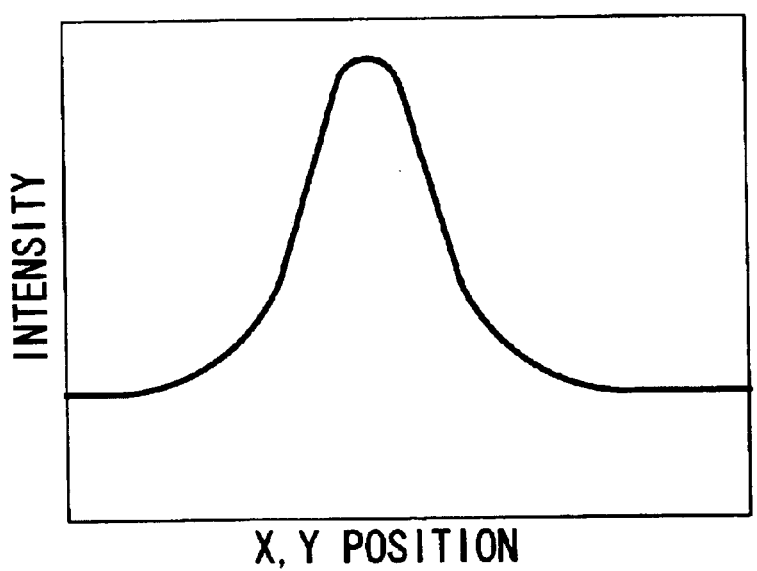
FIG. 4 is a view for explaining a light intensity distribution of a pattern image.

The above-described test pattern 15 is illuminated under the illumination condition σ≧1.0, and images of the plural patterns TPX of the test pattern 15 by the projection optical system 10 are imaged upon the plate 11a of the detection system 11 mounted on the wafer stage 12. With respect to each image, the intensity or quantity of light passing through the slit 11b of the plate 11a as the wafer stage 12 is moved and scanned in a horizontal direction (X or Y direction), is detected by the photoelectric detector 11c. By this, a detection signal such as shown in FIG. 4 corresponding to the light intensity or light quantity as detected at each X or Y position of the stage 12 (slit 11b), is obtainable. Thus, by calculating the center position or gravity center position of this detection signal, the center position of a single line of the mark 20a of the test pattern 15, i.e., pattern TPX or TPY, as imaged on the plate 11a, can be detected.

In this manner, central position information of the pattern images each representing the state of the wavefront at a corresponding position on the pupil plane of the projection optical system 10 is obtainable. Thus, by calculating the tilt of the wavefront at each position on the pupil plane from the central position information of the pattern images, the wavefront aberration of the optical system 10 is detected.

Figure 15:
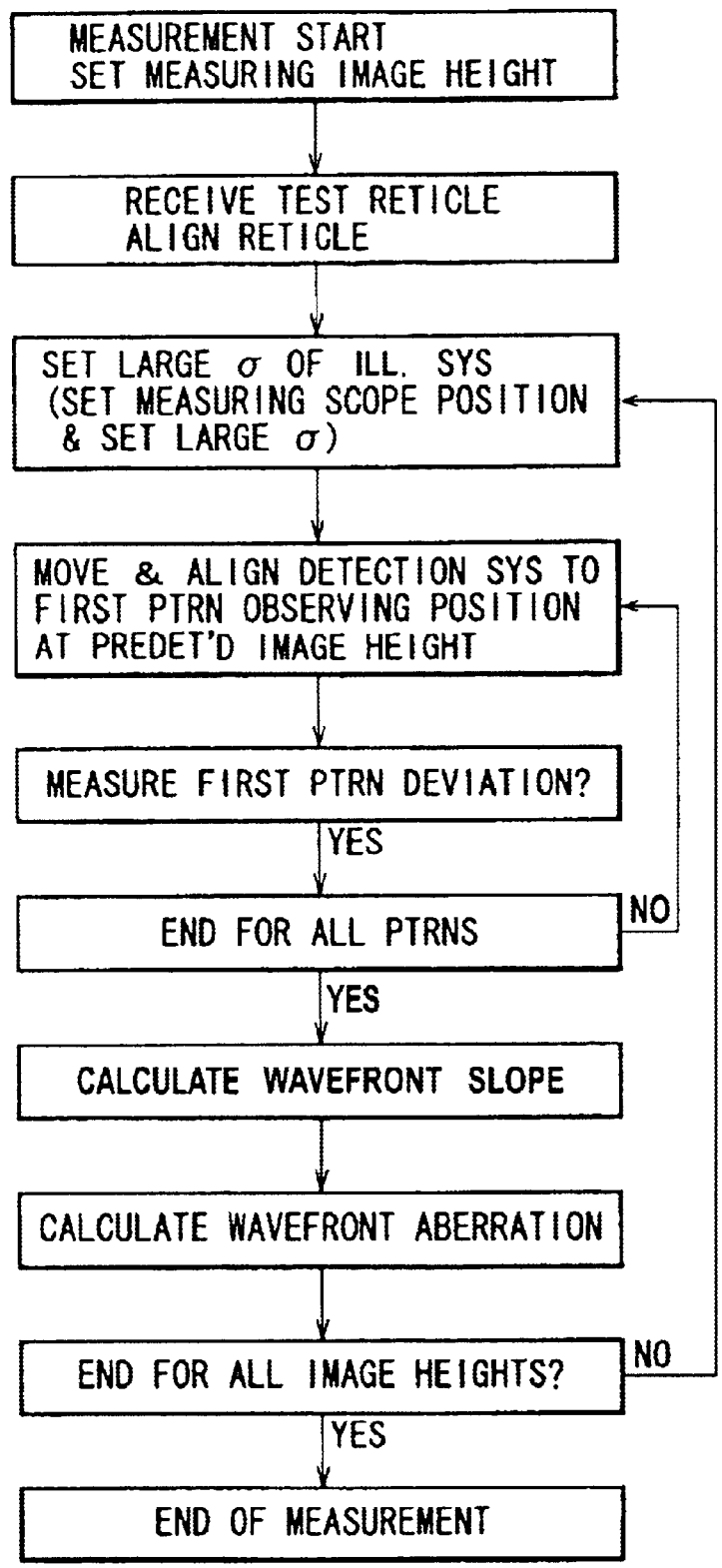
FIG. 15 is a flow chart of aberration measurement according to the present invention.

The sequence of wavefront aberration measurement in this embodiment is shown in the flow chart of FIG. 15.

By the way, the length and width of the slit 11b of the detection system 11 are set to be not greater than the grid pitch of the aerial image of the grid-like mark 20a and also to prevent an aerial image of a pattern TPX, next to an aerial image of a pattern TPX of a single line, which is just the subject of measurement, from coming into the slit 11b. Further, this embodiment has an arrangement that, in relation to an image of a pattern TPX of longitudinal lines and an image of a pattern TPY of lateral lines, separate pairs of slits 11b and photoelectric detectors 11c are prepared. However, it is a possible alternative that only one set of a slit and a photoelectric detector is prepared and measurement is performed while changing the longitudinal/lateral orientation of the slit in accordance with the longitudinal/lateral orientation of the pattern image whose light intensity distribution is just to be photoelectrically converted.

Next, referring to FIG. 11, a third embodiment of the present invention will be described. The third embodiment differs from the first and second embodiments only in the test reticle structure. Thus, the projection exposure apparatus into which a test reticle of the third embodiment is introduced is a projection exposure apparatus such as shown in FIG. 1, 2 or 17.

As compared with the first and second embodiments in which a light blocking portion with a pinhole 16 and a test pattern 15 (TP) are formed on the upper and lower surfaces of the test reticle 9 substrate, respectively, in the third embodiment, the test reticle 9 is provided by two plates, that is, a pinhole plate 9a having a light blocking portion with a pinhole 16 formed on the upper surface (or lower surface)

thereof and a pattern plate 9b having a test pattern 15 formed on the upper surface (or lower surface) thereof.

The functions and relationships of the test pattern 15, the pinhole 16 and the diffusing means 18 such as a scattering element or the like are similar to those in the first and second embodiments. Thus, even by use of a reticle or a measurement unit according to this embodiment, similar measurement of wavefront aberration of a projection optical system is attainable as in the first and second embodiments.

Figure 12:
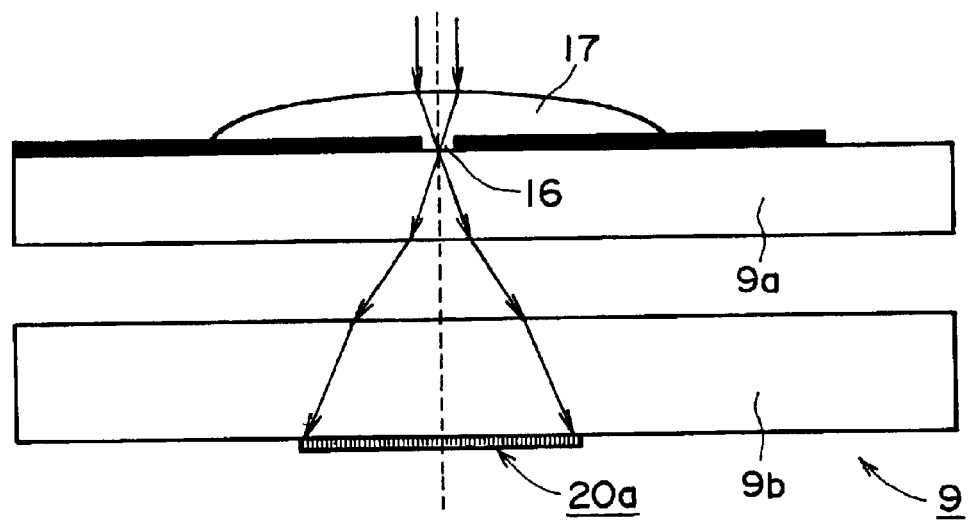
FIG. 12 is a sectional view for explaining a pattern plate and a pinhole plate, of a test reticle according to the present invention.

As one form of the structure wherein the optical characteristic measurement unit comprises two plates, there is a form as shown in FIG. 12 in which a pinhole plate 9a has a convex lens (positive lens) 17 as diffusing means disposed on a pinhole 16m, and a pattern plate 9b has a mark 20a of the test pattern 15 formed on the upper surface (or lower surface) thereof. In this case, the convex lens 17 and the light blocking portion with the pinhole 16 may be formed on either the upper surface or the lower surface of the pinhole plate 9a.

In the projection exposure apparatus shown in FIGS. 1 and 2, a dust protection glass (not shown) is provided above the reticle for prevention of contamination thereof. Thus, when a structure in which the optical characteristic measurement unit comprises two plates is used, the dust protection glass may conveniently be made detachably mountable so that the dust protection glass and the upper (light source side) plate of the two plates, for example, the plate 9a of FIGS. 11, 12 and 20–22, are made mutually interchangeably.

Figure 16:
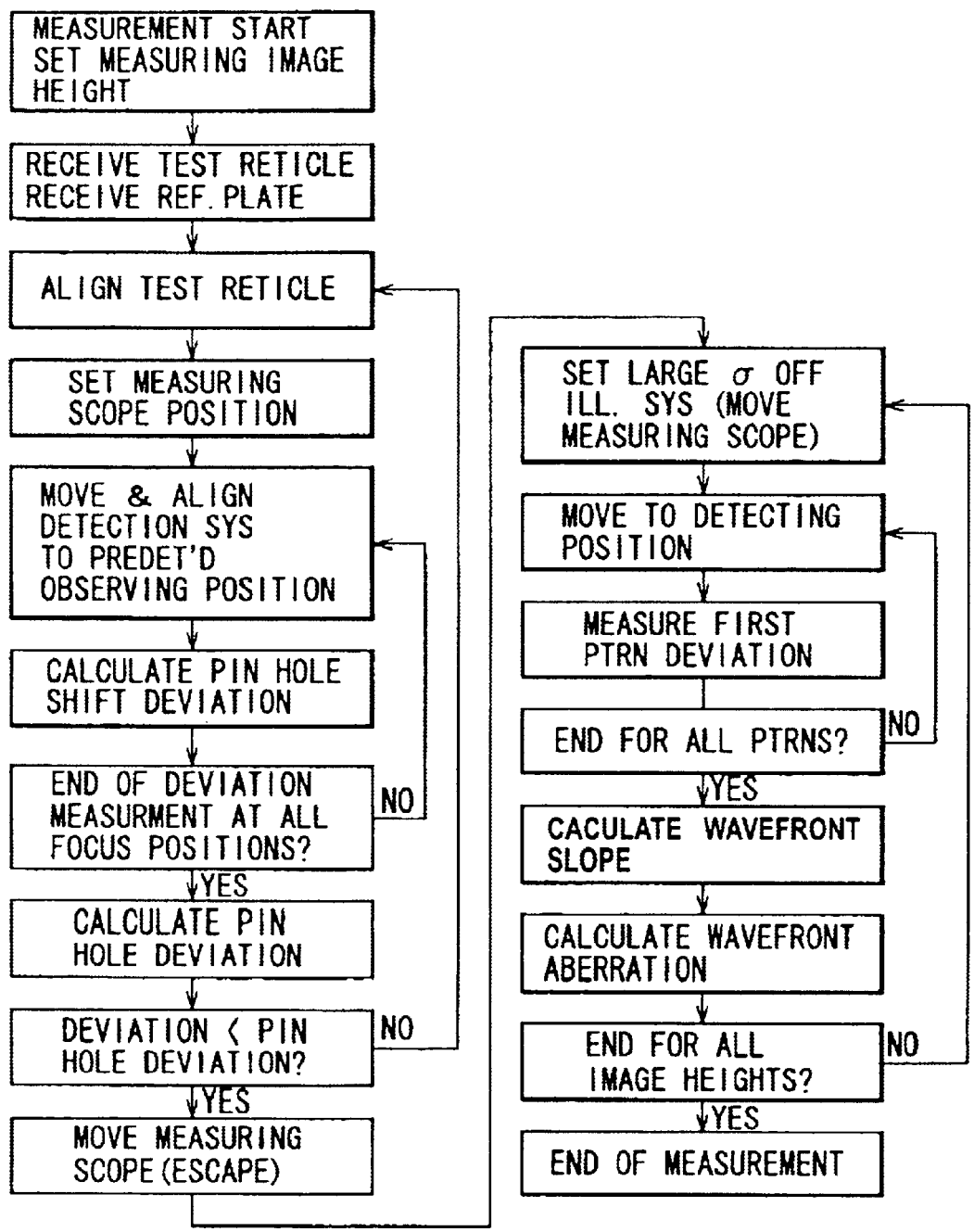
FIG. 16 is a flow chart of aberration measurement according to the present invention.

Referring to FIG. 16, the measurement sequence for measuring wavefront aberration of a projection optical system by use of the optical characteristic measurement unit shown in FIGS. 11 and 12, will be described.

A large distinction of the measurement sequence of this embodiment over the measurement sequence of the first and second embodiments (see FIG. 15) resides in that an alignment operation, for registering the center of a pinhole 16 with the center of a test pattern 15, is incorporated.

A test reticle 9 (plate 9b) in which a test pattern 15 is formed on the substrate front face (lower surface), but a light blocking portion with a pinhole is not formed on the substrate rear face (upper surface), which is inside an exposure apparatus, is loaded on a reticle stage 18. Similarly, a pinhole plate 9a inside the exposure apparatus is loaded between the test reticle 9 and a scope 19. At this moment, the center of the pinhole 18 or 16 on the pinhole plate 9a can be set at a predetermined X-Y position, with an error within the mechanical precision.

Subsequently, an alignment mark of the test reticle 9 and a reticle reference mark 21 are observed through the scope 19 to detect a relative positional deviation between the reticle and the apparatus major assembly, and relative alignment of them is carried out by moving the reticle 9 in X and Y directions by use of the reticle stage 20 to adjust the position thereof. After completion of alignment of the test reticle 9, the scope 19 is moved to an observation position (illumination position) for measurement of wavefront aberration and, simultaneously, the detection system 11 on the wafer stage 12 is moved to a predetermined (X, Y and Z) coordinate position, which is an observation position (detection position) for the wavefront aberration measurement. Then, by using the scope 19 and the detection system 11, the amount of deviation of the central position of an image of a predetermined pattern, of the test pattern 15, with respect to a reference position, is measured. Further, the detection system 11 is moved in the Z direction (optical axis 10b direction) by a predetermined amount, and again, the amount of positional deviation of the central position of the image of the same predetermined pattern from the reference position, at a Z (direction) position different from that in the preceding measuring, is carried out. This is repeated several times.

It is not always necessary that the pattern to be measured is the entire pattern (all lines of the grid-like mark), which constitutes the test pattern 15. Here, assuming that there are longitudinal and lateral lines at the center of the test pattern 15, the position (deviation) of the central position of each of the images of the patterns of the two, longitudinal and lateral lines, is measured.

Assuming that the telecentricity of projection lens 10 is in an idealistic state, positional deviations dx and dy of the center of the test pattern 15 of the pattern plate 9b and of the center of the pinhole 16 of the pinhole plate 9a are proportional to the positional deviation amounts dsx/dZ and dsy/dZ of the pattern images of the above-described two, longitudinal and lateral lines, and, therefore, they can be expressed by the following equations:

$$dx = t \cdot m \cdot dsx/dZ$$

$$dy = t \cdot m \cdot dsy/dZ$$

t: optical distance between pinhole 16 and test pattern 15
m: reduction rate of projection optical system 10
dsx/dZ, dsy/dZ: positional-deviation focus change.

From the result of the measurement using the scope 19 and the detection system 11, and on the basis of the above-described equations, the positional deviation amount of the pinhole 16 and the test pattern 15 can be calculated. Thus, by moving the reticle stage 20 by an amount corresponding to the detected positional deviation, the test pattern 15 of the reticle 9 is moved and positional alignment between the test pattern 15 center and the pinhole 16 center along the X-Y plane is carried out. Here, a closed loop is also possible, such that the scope 19 may be moved to the reticle reference mark position to observe the alignment mark of the test reticle 9 and the reticle reference mark 21 thereby to measure the movement amount of the reticle stage 20, and any remainder may be again fed back to a driving system for the reticle stage 20. This alignment process is repeated until the positional deviations dx and dy come into a tolerable range and, after that, measurement of wavefront aberration of the projection optical system 10 is performed in accordance with the same sequence as that of the flow of FIG. 15. When an illumination system for an exposure process is used for the wavefront aberration measurement, the scope 19 is retracted so as not to interfere with the illumination light.

In the foregoing, while taking up the first to third embodiments, some examples of the test reticle to be used for measurement of wavefront aberration of the projection optical system 10 have been described. Since the aerial image of each pattern of this test reticle is large in size, such as a few microns, in place of using the photoelectric detector 11c, a CCD, or a linear sensor, may be directly placed on the pattern imaging plane, without incorporating an enlarging optical system, to detect light intensity distribution or light quantity distribution of the aerial image. In that case, X-Y motion of the wafer stage 12 is unnecessary, for detection of the light intensity distribution or light quantity distribution of the aerial image (pattern image).

As an alternative for detecting the positions of images of patterns of the test pattern 15 (TP), the pattern images may be transferred onto a substrate mounted on the wafer stage 12 and having a photochromic material layer formed thereon, and the central positions of the thus transferred pattern images may be measured by using the off-axis alignment detection system 14. On this occasion, as compared with a case in which pattern images are transferred to a certain type of resist, a developing process is unnecessary.

By feeding back the obtained measured values to the major assembly, as shown in FIG. 2, a correcting optical system 162 inside the projection optical system 10 can be driven by use of driving means 161 or, as shown in FIG. 17, the center wavelength of an emission wavelength of a laser 172 can be changed by use of wavelength changing means 171. With such correction means, the system can be applied to automatic aberration correction in an exposure apparatus. It should be noted that FIG. 17 shows an example in which, in the first embodiment, a laser 172 is used as a light source. The basic structure thereof is the same as that of FIG. 1.

Further, the optical characteristic measuring method of the present invention can be applied as a calibration technique for a separate measuring system such as an optical characteristic measuring system using an interferometer. Currently, there is no tool which enables measurement of aberration of a projection optical system inside a projection exposure apparatus having an interferometer incorporated therein.

Therefore, the wavefront aberration amount of a projection lens mounted inside a projection exposure apparatus has to be substituted by a wavefront aberration amount of a projection lens as measured, with respect to the projection lens alone, by using an interferometer system inside an exposure apparatus manufacturing factory. Thus, it is necessary to assure the difference in wavefront aberration of the projection lens due to a difference in environment, for example, between that in the interferometer system and that in the exposure apparatus major assembly.

In consideration of this, the present method, which is small in load to an exposure apparatus or small in a system load, is used, and measurement of wavefront aberration of a projection lens is carried out both upon the exposure apparatus major assembly and upon the interferometer system. Based on this, the measurement result (wavefront aberration amount) obtained by use of the interferometer system inside the exposure apparatus manufacturing factory is calibrated.

Figure 8:
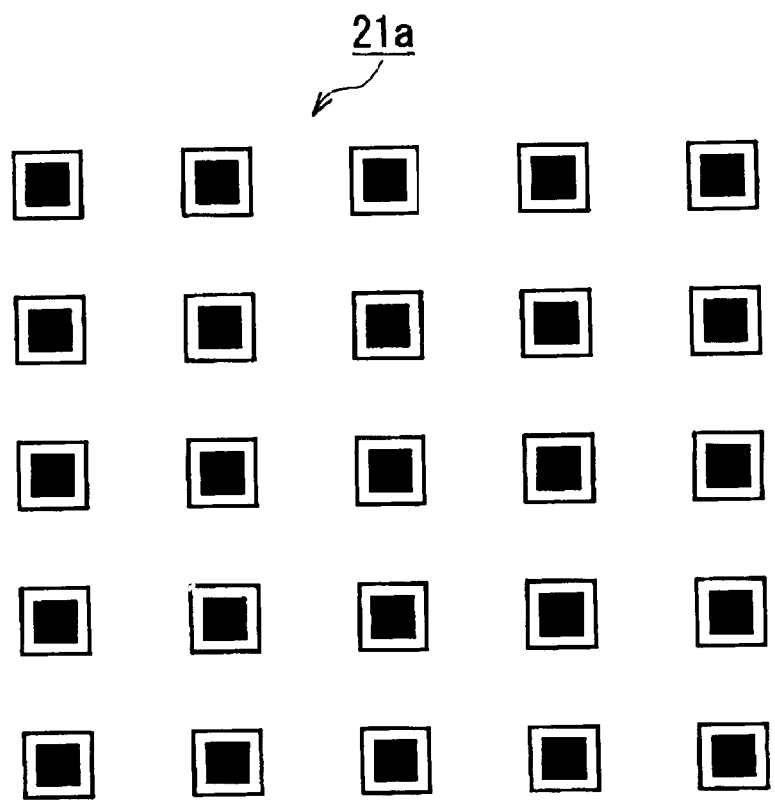
FIG. 8 is a view for explaining a mark 21a in FIG. 6.

In a fourth embodiment described below, a description will be made of an optical characteristic measuring method including a sequence in which images of patterns of a test pattern 15 are transferred to a photosensitive substrate (wafer) W and the transferred images are developed, and in which central positions of the transferred images, thus developed, are measured. The test pattern to be used is two types of patterns shown in FIGS. 7 and 8, and they are formed on a common test reticle 9.

Also, in this example, the exposure apparatus in which the optical characteristic of a projection optical system is to be measured by use of the reticle 9 is a projection exposure apparatus such as shown in FIG. 1, 2 or 17.

As has been described with reference to the first to third embodiments, the test pattern shown in FIG. 7 is constituted by a pattern group 20a, defining a grid-like mark. Patterns TPX and TPY of the pattern group may have a shape such as shown in FIG. 5A or 5B, but the fourth embodiment uses a mark of a type defining a pattern having a linewidth of 2–3 microns upon a wafer, and having a shape as shown in FIG. 5B.

On the rear face of the reticle having this test pattern 15 formed on the front face thereof, there is formed a light blocking portion with a pinhole whose central position is coincident with the center of the mark 20a. This reticle has a basic structure such as shown in FIG. 9 or 10, like the first and second embodiments. However, as compared with the first and second embodiments, it is provided with a grid-like mark 21a shown in FIG. 8, as a new pattern.

The grid-like mark 21a is a reference pattern group for measuring relative positional deviations of the patterns of the test pattern 15. As compared with the mark 20a of the test pattern 15, there is no light blocking portion with a pinhole above (i.e., effective light source side of) that mark. Thus, light beams from an illumination system are projected uniformly on the reference patterns of the grid mark 21a, such that these reference patterns are illuminated with light beams of substantially the same intensity and from the same direction, and they are imaged upon the photosensitive substrate through the projection optical system 10.

Figure 13:
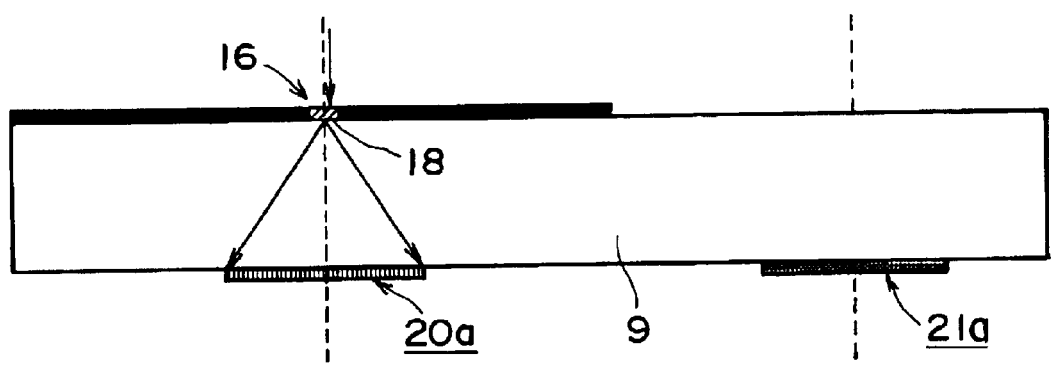
FIG. 13 is a sectional view for explaining a yet further example of a test reticle according to the present invention.
Figure 14:
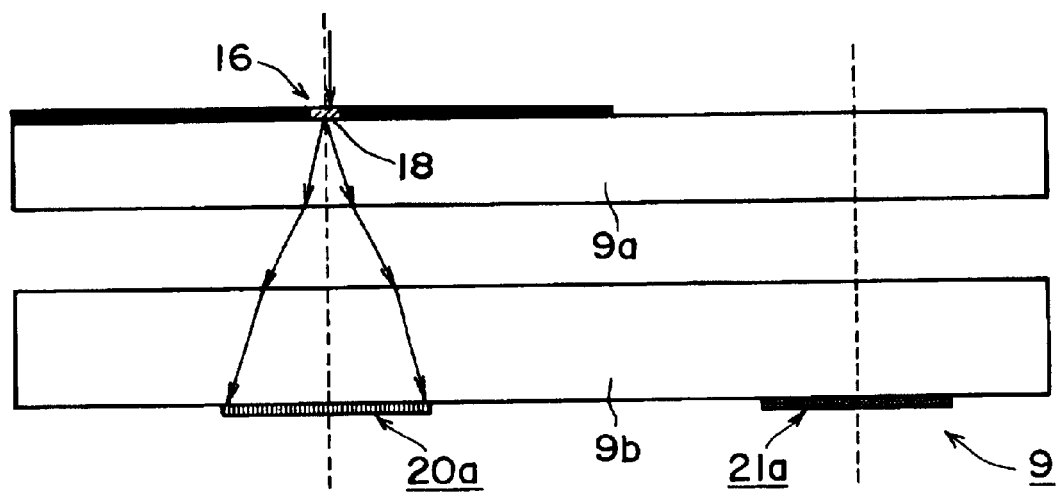
FIG. 14 is a sectional view for explaining a pattern plate and a pinhole plate, in a still further example of a test reticle according to the present invention.

FIGS. 13 and 14 are fragmentary sectional views, respectively, showing examples of the test reticle in the fourth embodiment. FIG. 13 shows an example in which a light blocking portion having a pinhole 16 is formed on a rear face (upper surface) of the substrate of the test reticle 9, while a pattern group 20a and a reference pattern group 18 as a test pattern are formed on the front face (lower surface) of the substrate.

FIG. 14 shows a case using two plates, that is, a pattern plate 9b having a pattern group 20a and a reference pattern group 18 as a test pattern formed on the front face (lower surface) of a substrate, and a pinhole plate 9a having a light blocking portion with a pinhole 16. formed on the rear face (upper surface) of a separate substrate.

Each of the reticles shown in FIGS. 13 and 14 has a scattering element or a grating pattern provided inside the pinhole 16. Due to the function of this element inside the pinhole, the pattern group 20a is illuminated with a condition $\sigma > 1$.

The sequence of optical characteristic measurement in the fourth embodiment will now be described.

The test reticle 9 is illuminated under a standard illumination condition ($1.0 > \sigma > 0.7$) and the marks 20a and 21a of the test pattern are illuminated, and images of these patterns are projected and transferred to a photosensitive substrate through the projection optical system 10.

Subsequently, the wafer stage 12 or, alternatively, the reticle stage 20 is moved so that the marks 20a and 21a are positionally superposed one upon another. In this positional relation, the marks 20a and 21a are illuminated with the standard illumination condition and, under the influence of the scattering element, a grating pattern or a convex lens, the test pattern is illuminated with an illumination condition of $\sigma > 1.0$, light beams being projected to the patterns of the pattern group 20a from mutually different directions. The images of these patterns are projected and transferred to the photosensitive substrate through the projection optical system 10.

Figure 6:
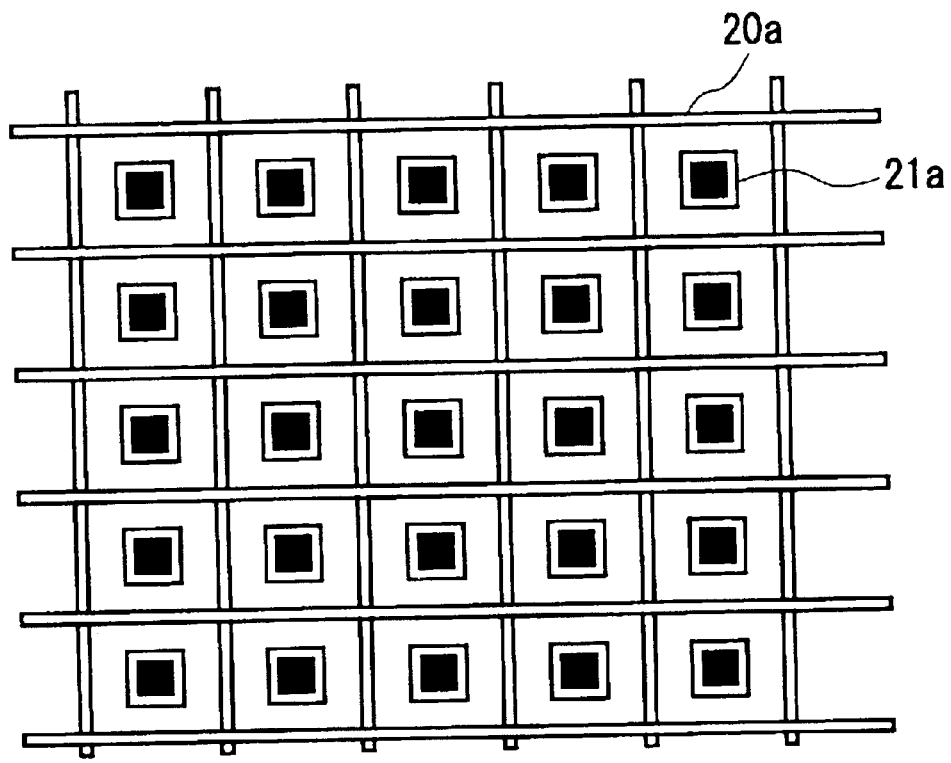
FIG. 6 is a view for explaining specific deposition of a test pattern according to the present invention.

Through these projection exposures described above, as shown in FIG. 6, images of the pattern groups of the marks 20a and 21a are transferred to the photosensitive substrate. After developing this photosensitive substrate, a relative positional deviation between corresponding pattern images is measured by use of a measuring tool known in the art. On the basis of the thus obtained relative positional deviations, a calculation is carried out to detect the wavefront of the projection optical system 10 at the pupil plane 10a, and the wavefront aberration of the projection optical system 10 as well as various aberrations (Seidel's five aberrations) are detected. Also, the state of aberrations as measured may be fed back to the major assembly, to perform aberration correction of the projection lens.

Figure 22:
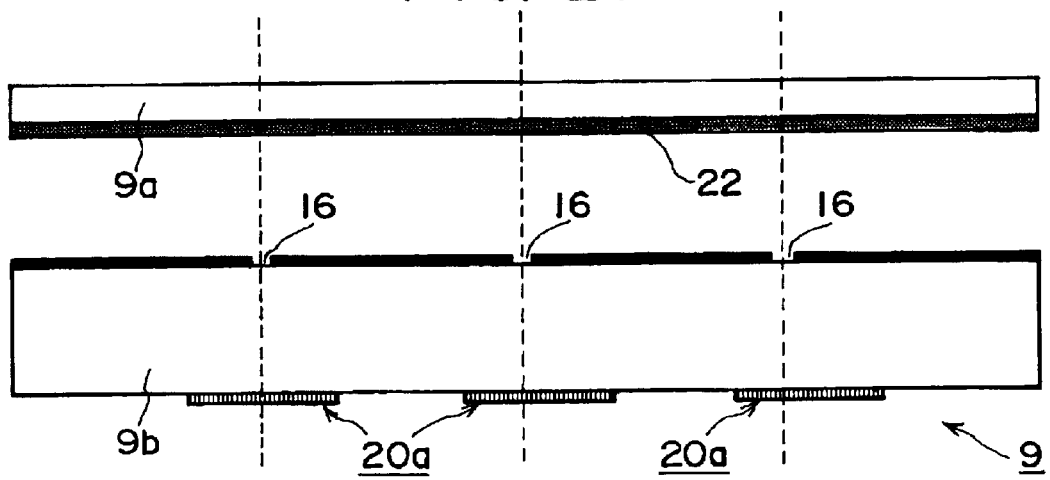
FIG. 22 is a sectional view for explaining a pattern plate and a pinhole plate, in a still further example of a test reticle according to the present invention.

Further, as shown in FIG. 22, test patterns 15 and pinholes 16 may be provided at several locations, on one and the same reticle 9, having different image heights. This enables wavefront aberration measurement with respect to different image heights.

Figure 18:
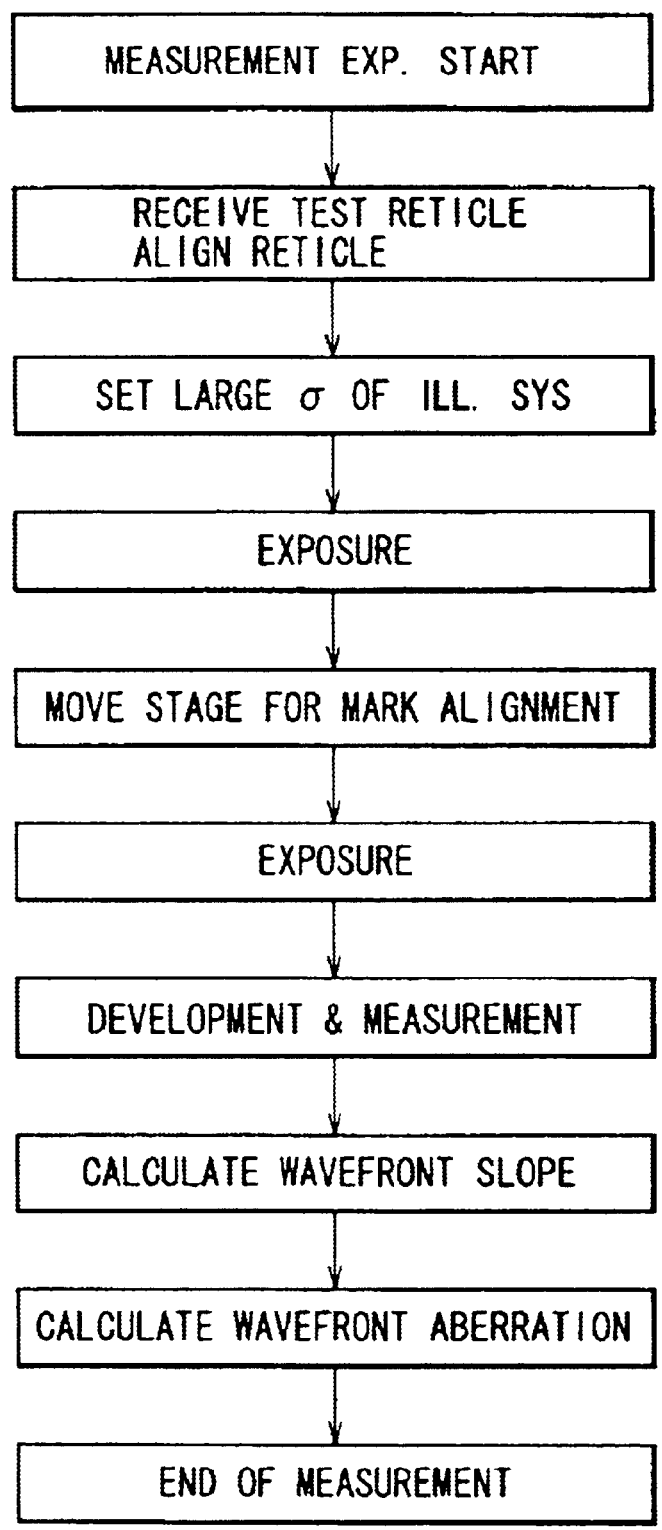
FIG. 18 is a flow chart of aberration measurement according to the present invention.
Figure 19:
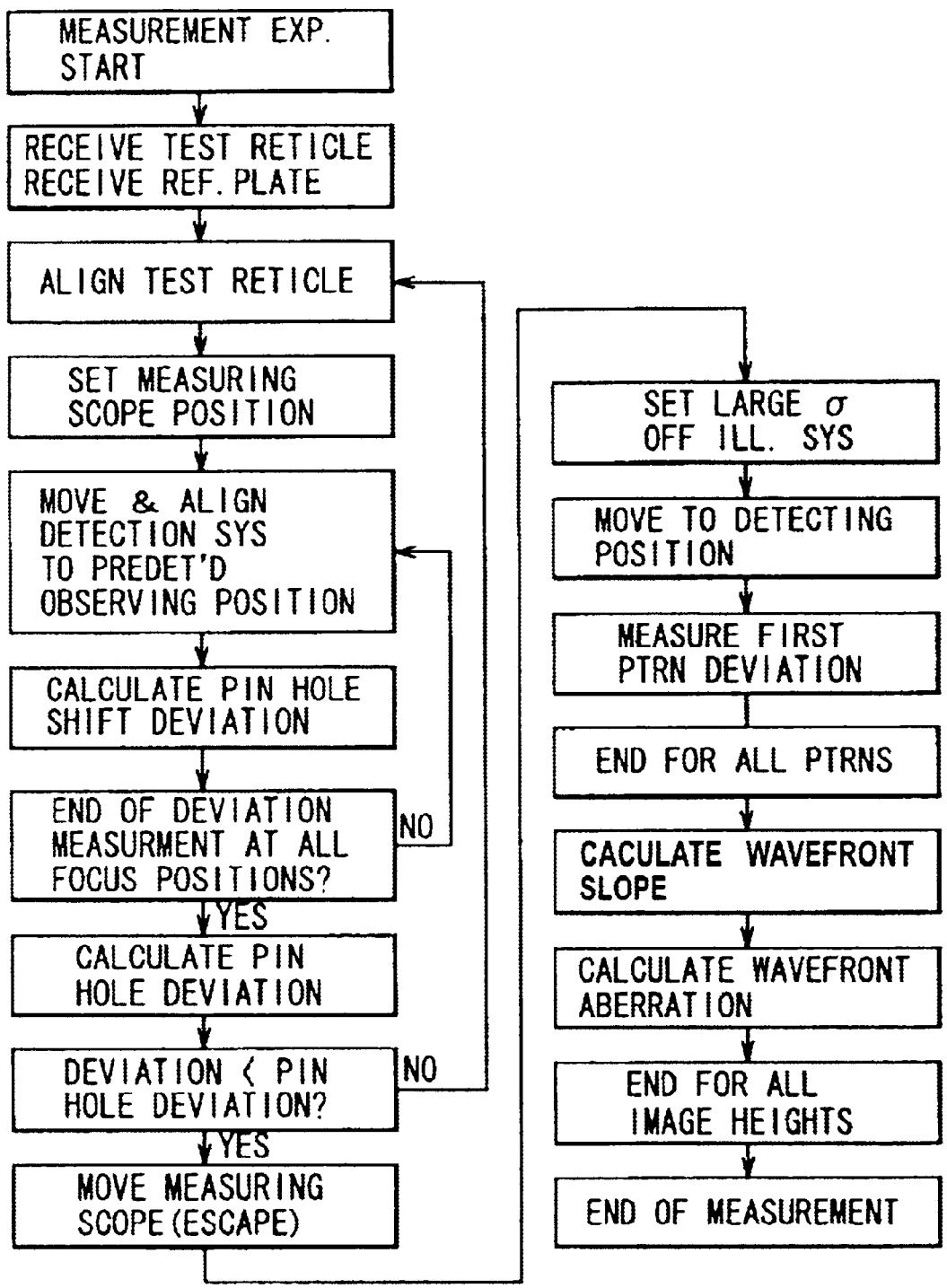
FIG. 19 is a flow chart of aberration measurement according to the present invention.

FIG. 18 shows the sequence of measurement using the test reticle of FIG. 13 and FIG. 19 shows the sequence of measurement using the test reticle of FIG. 14. As regards the exposure sequence using the pinhole plate 9a, also, it is carried out in accordance with the sequence such as shown in FIG. 19.

Figure 20:
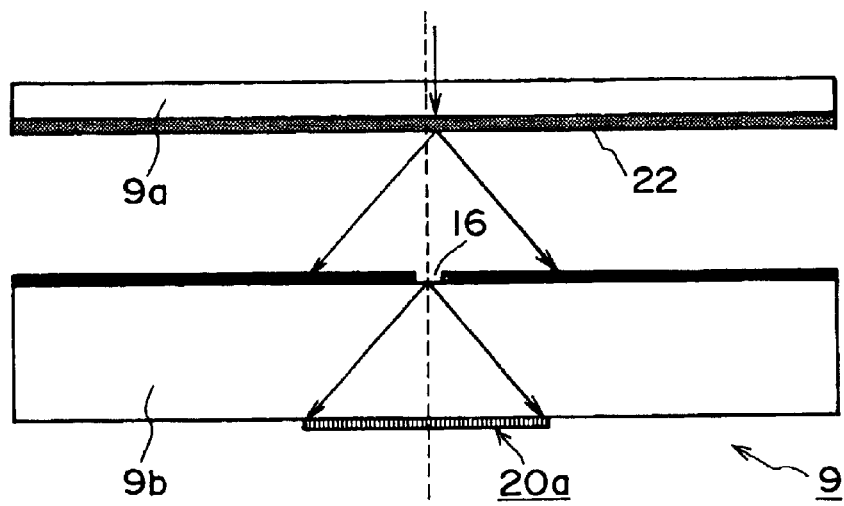
FIG. 20 is a sectional view for explaining a pattern plate and a pinhole plate, in a still further example of a test reticle according to the present invention.

FIG. 20 shows another example of the test reticle, as a fifth embodiment of the present invention. Also, in this example, the exposure apparatus in which the optical characteristic of a projection optical system is to be measured by use of the test reticle, is a projection exposure apparatus such as shown in FIG. 1, 2 or 17.

The test reticle shown in FIG. 20 is an example in which a light blocking portion with a pinhole 16 and a pattern group 20a of a test pattern are formed on the upper surface (rear face) and the lower surface (front face) of a common plate (glass) 9b, respectively, and in which a plate (glass) 9a having a scattering element 22 for light diffusion for accomplishing illumination of the pattern group 20a under an illumination condition σ>1.0, being formed on the lower surface, is disposed above the pattern plate 9b. As regards the scattering element for diffusion, a ground glass for scattering light or a diffraction grating such as CGH or the like for scatting light, may be used. When such a scattering element 22 for scattering light is used, as in the preceding embodiments, an effective light source having a brightness higher at the periphery than at the center, is produced by the illumination system. By optimizing the size and shape thereof, non-uniformness of illuminance upon the pinhole 16 or test pattern 20a can be removed, and the illuminance distribution can be made uniform.

Here, the illuminance uniformness refers to a state in which the intensities of plural light beams projected to the patterns of the pattern group 20a from mutually different directions are made substantially uniform. If such a stage is accomplished, the exposure amounts for exposure of plural pattern images become substantially constant, and thus, the produced pattern images have the same linewidth. This reduces an error based on the exposure amount, in the aberration measurement or positional deviation detection for a pattern image.

As regards the position of the plate 9a having a scattering element 22, it may be placed anywhere if it is on the effective light source side of (i.e., above) the test reticle 9. For example, it can be placed adjacent to the projection type reticle blind 6 of FIG. 2 or 17 or at a desired position inside the illumination system. Further, as described hereinbefore, it is convenient that the plate 9a can be mounted in place of a dust protection glass just above the reticle stage and disposed at this position. As regards a member for holding the dust protection glass and the plate 9a, it may either be fixed to the illumination system or be held by the major assembly (projection optical system).

Figure 21:
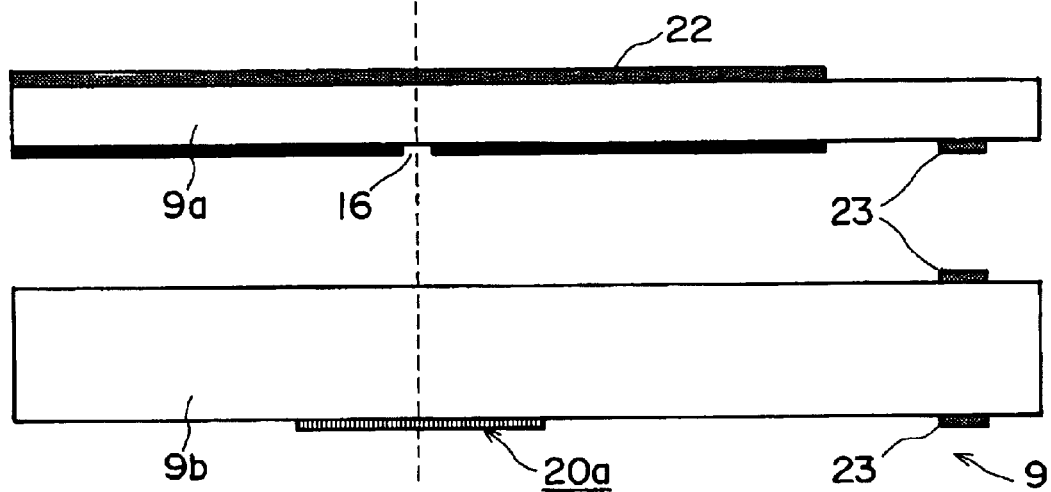
FIG. 21 is a sectional view for explaining a pattern plate and a pinhole plate, in a still further example of a test reticle according to the present invention.

FIG. 21 shows another example of the test reticle, as a sixth embodiment of the present invention. Also, in this example, the exposure apparatus in which the optical characteristic of a projection optical system is to be measured by use of the test reticle is a projection exposure apparatus such as shown in FIG. 1, 2 or 17.

Figure 11:
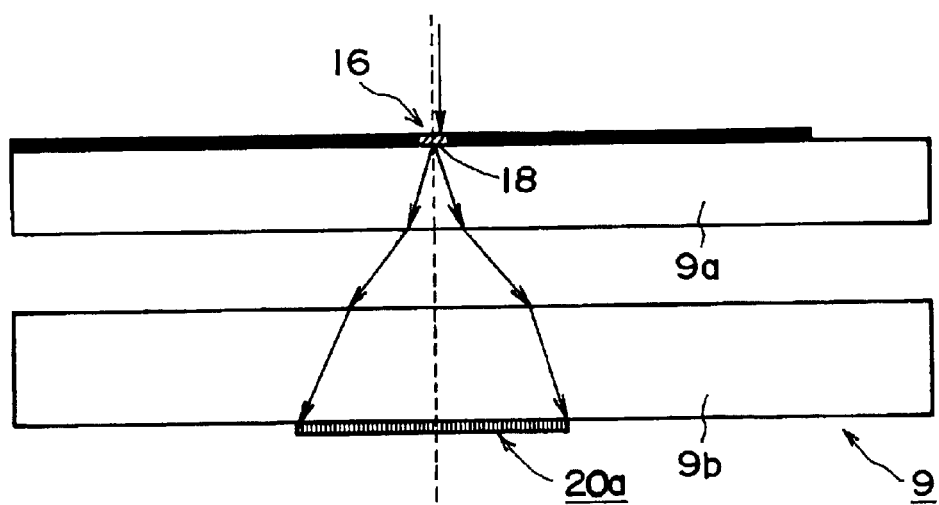
FIG. 11 is a sectional view for explaining a pattern plate and a pinhole plate, in a further example of a test reticle according to the present invention.

The example shown in FIG. 21 is a modified form of the examples of FIGS. 11 and 20. A pattern group 20a of the test pattern is formed on the front face (lower surface) of the pattern plate 9b. A light blocking portion with a pinhole 16 as well as a scattering element 22 for light diffusion are formed on a separate pinhole plate 9a. The plate 9a is disposed above the reticle 9b.

With the structure having two plates shown in FIG. 21, relative alignment of the center of the pinhole 16 and the center of the pattern group 20a can be accomplished by moving the reticle stage 20. Further, the reticle 9b and the plate 9a may have alignment marks 23, and these marks may be observed through the scope 19. With this procedure, relative positional deviation between these plates can be measured directly.

Any deviation between the center of the pinhole 16 and the center of the test pattern 20a along a horizontal direction causes a deviation of an imaging light ray from the pupil center of the projection lens 10. Thus, it leads to a result that the reference coordinate (pupil center reference) for the wavefront calculation differs from the actually measured coordinate of the measurement point. This is one error factor for wavefront aberration measurement. In consideration of it, as in the measurement unit shown in FIG. 11 or 21, the pinhole 15 and the test pattern 20a are formed on different plates, respectively, and the relative alignment of them is carried out by the reticle stage. With this arrangement, the measurement precision can be increased.

In a case in which a light blocking portion having a pinhole 16 and a pattern group 20a of a test pattern are to be provided on the upper and lower surfaces of the glass substrate (plate) of the reticle 9, respectively, as shown in FIG. 22, light blocking portions with pinholes 16 and pattern groups 20a of the test pattern may be formed on a glass substrate in such a manner that: plural sets of pinholes and test patterns 20a are disposed in juxtaposition with each other, while each set is designed so that the center of the pinhole and the center of the test pattern have a small amount of mutual deviation. The light blocking portions with pinholes 16 and the pattern groups 20a of the test pattern are formed on a glass substrate. With this arrangement, a particular set having a smallest deviation can be chosen for measurement of an optical characteristic, and the measurement precision can be increased.

[Industrial Applicability]

In accordance with the present invention as described above, an optical characteristic measuring method and reticle usable therefor, which can be suitably used for high-precision measurement of an optical characteristic such as wavefront aberration, for example, are accomplished.

What is claimed is:

1. An optical characteristic measuring method for measuring an optical characteristic of a projection optical system, said method comprising:

supplying a reticle having a plurality of patterns;

directing scattered light beams from an aperture formed on a light blocking member to the plurality of patterns on the reticle, whereby respective light beams which are from the aperture and which are incident on each of the plurality of patterns are in mutually different directions, by which images of the plurality of patterns are formed through the projection optical system; and detecting positions of the images of the plurality of patterns and, by use of the result of the detection, detecting the optical characteristic of the projection optical system, wherein the pattern has lines and spaces for directing substantially only zeroth order light to the projection optical system.

2. An optical characteristic measuring method according to claim 1, wherein the light blocking member is present on the reticle.

3. An optical characteristic measuring method according to claim 1, wherein the light blocking member is present above the reticle.

4. An optical characteristic measuring method according to claim 2 or claim 3, wherein the light directed from the aperture is scattered light produced by a scattering portion.

5. An optical characteristic measuring method according to claim 4, wherein the scattering portion is present inside the aperture.

6. An optical characteristic measuring method according to claim 4, wherein the scattering portion is present between a light source and the aperture.

7. An optical characteristic measuring method according to claim 4, wherein the scattering portion is illuminated by an effective light source.

8. An optical characteristic measuring method according to claim 1, wherein the aperture is a pinhole.

9. An optical characteristic measuring method according to claim 1, wherein the pattern has an opening portion for producing a predetermined periodic component on a pupil plane of the projection optical system as well as periodic opening portions defined at opposite sides of that opening portion and for producing a periodic component, different from the periodic component, on the pupil plane of the projection optical system.

10. An optical characteristic measuring method according to claim 1, wherein the pattern has lines and spaces in which, with respect to a direction of repetition and from a center to a periphery, the spaces have a substantially regular pitch while widths of the spaces gradually decrease, and in which adjacent lines are not resolvable by the projection optical system.

11. An optical characteristic measuring method according to claim 1, wherein the detecting step includes a step of photoelectrically converting an aerial image of the plurality of patterns.

12. An optical characteristic measuring method according to claim 1, wherein the detecting step includes a step of exposing a photosensitive substrate with an image of the plurality of patterns, and a step of developing the photosensitive substrate.

13. An optical characteristic measuring method according to claim 1, wherein the optical characteristic includes wavefront aberration.

14. A projection exposure apparatus having a mode for measuring an optical characteristic of a projection optical system in accordance with a measuring method as recited in claim 1, and having an illumination system for projecting illumination light to the plurality of patterns when the reticle is supplied to said apparatus.

15. A device manufacturing method comprising:
supplying a reticle for device manufacture to a projection exposure apparatus as recited in claim 14; and
exposing a substrate by projecting a pattern of the reticle for device manufacture onto the substrate via the projection optical system.

16. A reticle, comprising:
a plurality of patterns formed on a front face of a substrate; and
a light blocking portion with an aperture, being formed on a rear face of the substrate, and a light scattering portion for producing scattered light beams from the aperture,
wherein the pattern has lines and spaces for exiting substantially only zeroth order light.

17. A reticle according to claim 16, wherein the aperture is a pinhole.

18. A reticle according to claim 16, wherein the light scattering portion is present inside the aperture.

19. A measurement unit for measuring an optical characteristic of a projection optical system, said unit comprising:
a reticle having a plurality of patterns formed on a front face of a substrate; and
a light blocking portion with an aperture, being formed on a rear face of the substrate, as well as a light scattering portion for producing scattered light beams from the aperture, wherein the pattern has lines and spaces for exiting substantially only zeroth order light.

20. A reticle according to claim 19, wherein the aperture is a pinhole.

21. A measurement unit according to claim 19, wherein said light blocking portion is formed on a rear face of said substrate, and said light scattering portion is formed on another substrate.

22. A measurement unit according to claim 21, wherein said light scattering portion is formed on a reticle side surface of the other substrate.

23. A measurement unit according to claim 19, wherein said light blocking portion and said light scattering portion are formed on another substrate.

24. A measurement unit according to claim 22, wherein said light blocking portion is formed on a reticle side surface of the other substrate, and said light scattering portion is formed on a surface of the other substrate, opposite to the reticle side.

25. A measurement unit according to claim 22, wherein said light blocking portion and said light scattering portion are formed on a surface of the other substrate, opposite to the reticle side.

26. An optical characteristic measuring method for measuring an optical characteristic of a projection optical system, said method comprising:
supplying a reticle having a plurality of patterns;
directing scattered light beams from an aperture formed on a light blocking member to the plurality of patterns on the reticle, whereby respective light beams which are from the aperture and wich are incident on each of the plurality of patterns are in mutually different directions, by which images of the plurality of patterns are formed through the projection optical system; and
detecting positions of the images of the plurality of patterns and, by use of the result of the detection, detecting the optical characteristic of the projection optical system,
wherein the pattern has lines and spaces in which, with respect to a direction of repetition and from a center to periphery, the spaces have a substantially regular pitch while widths of the spaces gradually decrease, and in which adjacent lines are not resolvable by the projection optical system.

27. A projection exposure apparatus having a mode for measuring an optical characteristic of a projection optical system in accordance with a measuring method as recited in claim 26, and having an illumination system for projecting illumination light to the plurality of patterns when the reticle is supplied to said apparatus.

28. A device manufacturing method comprising:
supplying a reticle for device manufacture to a projection exposure apparatus as recited in claim 27; and
exposing a substrate by projecting a pattern of the reticle for device manufacture onto the substrate via the projection optical system.

29. A reticle comprising:

a plurality of patterns formed on a front face of a substrate and a light blocking portion with an aperture, being formed on a rear face of the substrate; and a light scattering portion for producing scattered light from the aperture, wherein the pattern has lines and spaces in which, with respect to a direction of repetition and from a center to periphery, the spaces have a substantially regular pitch while width of the spaces gradually decrease.

30. A measurement unit for measuring an optical characteristic of a projection optical system, said unit comprising:

a reticle having a plurality of patterns formed on a front face of a substrate; and a light blocking portion with an aperture, being formed on a rear face of the substrate, as well as light scattering portion for producing scattered light from the aperture, wherein the pattern has lines and spaces for exiting substantially only zeroth order light.

* * * * *

UNITED STATES PATENT AND TRADEMARK OFFICE
CERTIFICATE OF CORRECTION

| | | |
|---|---|---|
| PATENT NO. | : 6,982,786 B2 | Page 1 of 3 |
| APPLICATION NO. | : 10/307945 | |
| DATED | : January 3, 2006 | |
| INVENTOR(S) | : Yoshihiro Shiode | |

It is certified that error appears in the above-identified patent and that said Letters Patent is hereby corrected as shown below:

ON THE COVER PAGE:

In item "(30) Foreign Application Priority Data,"the listed document "April 17, 2002 (JP) …………………….. 2002/114425" should read -- April 17, 2002 (JP) …………………..2002-11442511. --.

In item "(56) References Cited," under "FOREIGN PATENT DOCUMENTS," the first-listed document "JP 6-120116 9/1994" should read -- JP 6-120116 4/1994 --.

In item "(56) References Cited," under "OTHER PUBLICATIONS," the first-listed document, "International Search report dated Oct. 22, 2002, and issued on Nov. 5, 2002, in corresponding International patent appln. No. PCT/JP02/07342."

should read

"International Search report dated Oct. 22, 2002, and issued on Nov. 5, 2002, in corresponding International Patent Appln. No. PCT/JP02/07342."

ON THE COVER PAGE (continued):

In item "(56) References Cited," under "OTHER PUBLICATIONS," the second-listed document, "International Preliminary Examination Report dated Oct. 30, 2003, transmitted in a Notification of Translation of Copies of the international Preliminary Examination report, mailed Nov. 18, 2004, in corresponding PCT application number PcT/JP2002/007342."

should read

"International Preliminary Examination Report dated Oct. 30, 2003, transmitted in a Notification of Translation of Copies of the International Preliminary Examination Report, mailed Nov. 18, 2004, in corresponding PCT application number PCT/JP2002/007342."

UNITED STATES PATENT AND TRADEMARK OFFICE
CERTIFICATE OF CORRECTION

| | |
|---|---|
| PATENT NO. | : 6,982,786 B2 |
| APPLICATION NO. | : 10/307945 |
| DATED | : January 3, 2006 |
| INVENTOR(S) | : Yoshihiro Shiode |

It is certified that error appears in the above-identified patent and that said Letters Patent is hereby corrected as shown below:

IN THE DRAWINGS:
    FIG. 16, Sheet 10 of 14, in the fifth box down in the right-hand column of the flowchart, "CACULATE" should read -- CALCULATE --.

IN THE DRAWINGS (continued):
    Fig. 19, Sheet 13 of 14, in the fifth box down in the right-hand column of the flowchart, "CACULATE" should read -- CALCULATE --.

COLUMN 2:
    Line 46, "transform-including" should read -- transform including --.
    Line 57, "to used" should read -- to be used --

COLUMN 4:
    Line 57, "the-other" should read -- the other --.

COLUMN 7:
    Line 8, "first-relay" should read -- first relay --.

COLUMN 8:
    Line 31, "example;" should read -- example, --.
    Line 49, "sur face" should read -- surface --.

COLUMN 11:
    Line 29, "ably." should read -- able. --.

COLUMN 14:
    Line 28, "pinhole 16." should read -- pinhole 16 --.

COLUMN 17:
    Line 48, the first occurrence of "the" should read -- a --.

COLUMN 18:
    Line 10, after "aperture," the right margin should be closed up and a new paragraph should be indented with "wherein".
    Line 41, "wich" should read -- which --.

UNITED STATES PATENT AND TRADEMARK OFFICE
CERTIFICATE OF CORRECTION

PATENT NO. : 6,982,786 B2
APPLICATION NO. : 10/307945
DATED : January 3, 2006
INVENTOR(S) : Yoshihiro Shiode It is certified that error appears in the above-identified patent and that said Letters Patent is hereby corrected as shown below:

COLUMN 19:
Line 6, after "aperture," the right margin should be closed up and a new paragraph should be indented with "wherein".
Line 9, "width" should read -- widths --.

COLUMN 20:
Line 5, "as light" should read -- as a light --.
Line 7, before "wherein", the paragraph should be indented.

Signed and Sealed this

Eighth Day of August, 2006

JON W. DUDAS
*Director of the United States Patent and Trademark Office*